United States Patent
Kasai

(10) Patent No.: US 6,680,861 B2
(45) Date of Patent: Jan. 20, 2004

(54) FERROELECTRIC MEMORY AND A TEST METHOD THEREOF

(75) Inventor: Masanori Kasai, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/193,160

(22) Filed: Jul. 12, 2002

(65) Prior Publication Data

US 2003/0063488 A1 Apr. 3, 2003

(30) Foreign Application Priority Data

Sep. 28, 2001 (JP) ........................... 2001/299875

(51) Int. Cl.$^7$ ............................................. G11C 11/22
(52) U.S. Cl. .......................... 365/145; 365/63; 365/201
(58) Field of Search ................................. 365/145, 149, 365/63, 201, 230.03, 190, 157, 158

(56) References Cited

U.S. PATENT DOCUMENTS 6,067,265 A * 5/2000 Mukunoki et al. .......... 365/145
6,157,565 A * 12/2000 Wu et al. .................... 365/145
6,201,727 B1 * 3/2001 Jeon ............................ 365/145

OTHER PUBLICATIONS

"Low Power Consumption and High–Speed LSI Technology", issued by Realize Co., Ltd., pp. 234–236 (Japanese Language).

* cited by examiner

Primary Examiner—Tan T. Nguyen
(74) Attorney, Agent, or Firm—Nixon Peabody LLP; Donald R. Studebaker

(57) ABSTRACT

A ferroelectric memory comprises a first memory cell which is provided at a point where a first word line and a first or second bit line intersect, and has a first ferroelectric capacitor formed with a ferroelectric material as an insulating film, capacitor; a first sense amplifier connected to the first and second bit lines, for amplifying a signal read from the first memory cell; a second memory cell which is provided at a point where a second word line and a third or fourth bit line intersect, and has a second ferroelectric capacitor formed with a ferroelectric material as an insulating film; a second sense amplifier connected to the third and fourth bit lines, for amplifying a signal read from the second memory cell; a first switch for electrically connecting the first bit line and the third bit line; and a second switch for electrically connecting the second bit line and the fourth bit line.

14 Claims, 14 Drawing Sheets

US 6,680,861 B2

FERROELECTRIC MEMORY AND A TEST METHOD THEREOF

BACKGROUND OF THE INVENTION

1. Field of the Invention

The present invention relates to a ferroelectric memory, and particularly to a ferroelectric memory having a circuit structure for selecting a defective memory cell, and a method of efficiently selecting a defective memory cell lying within the ferroelectric memory with low power consumption.

This application is a counterpart of Japanese patent application, Serial Number 299875/2001, filed Sep. 28, 2001, the subject matter of which is incorporated herein by reference.

2. Description of the Related Art

A FeRAM (Ferroelectric Random Access Memory) has been known as a conventional ferroelectric memory. For instance, a 2-transistor 2-capacitor/one-bit type is known as the FeRAM. The 2-transistor 2-capacitor/one-bit type FeRAM is a FeRAM which stores one binary information by means of two memory cells, i.e., two transistors and two capacitors.

As a reference that has disclosed the FeRAM, there is known, for example, "Low Power Consumption and High-Speed LSI Technology issued by Realize Co., Ltd, p.234-p.236";

A memory cell array of a general FeRAM is provided with memory cell groups arranged in matrix form. FIG. 12 shows a structure of such a memory cell array, corresponding to one sequence thereof. As shown in FIG. 12, a first memory cell M0 and a second memory cell M1 of a ferroelectric memory 2200 are respectively equipped with a first selection transistor T0, a second selection transistor T1, a first ferroelectric capacitor C0 and a second ferroelectric capacitor C1. The first ferroelectric capacitor C0 and the second ferroelectric capacitor C1 respectively store binary data therein as polarization directions. In a 2-transistor 2-capacitor/1-bit type ferroelectric memory, binary or digitized data different in value are respectively stored in ferroelectric capacitors (e.g., the first ferroelectric capacitor C0 and the second ferroelectric capacitor C1) of one memory cell pair (e.g., a pair of the first memory cell M0 and the second memory cell M1).

FIG. 13 is a timing chart for describing a data read operation of the ferroelectric memory 2200. In FIG. 13, 'L' indicates a ground voltage, and 'H' indicates a source voltage Vcc. Further, 'Vh' indicates a voltage which is higher than the source voltage Vcc and is increased by about a threshold voltage Vt of each of the first and second selection transistors T0 and T1.

At a time t1, the voltage applied to a precharge control line PCHG is first rendered L to turn off a first precharge transistor PCT0 and a second precharge transistor PCT1. Thus a first bit line BL0 and a second bit line BL1 are respectively brought to a floating state.

Next, the voltages applied to a first word line WL0 and a second word line WL1 are respectively set to the Vh to turn on the first selection transistor T0 and the second selection transistor T1.

When the voltage applied to a first plate line PL0 is brought to the H at a time t3, the voltage of the plate line PL0 is applied to the first bit line BL0 and the second bit line BL1 through the first ferroelectric capacitor C0, the second ferroelectric capacitor C1, the first selection transistor T0 and the second selection transistor T1, so that read voltages are developed in the first bit line BL0 and the second bit line BL1. Since the first ferroelectric capacitor C0 and the second ferroelectric capacitor C1 are different in capacitance according to the direction of polarization, the read voltages developed in the first bit line BL0 and the second bit line BL1 are also different in value from each other according to the polarization direction.

When the voltage applied to an activation signal line SAE is brought to the H at a time t4, a sense amplifier SA is activated. Thus the voltages of the first bit line BL0 and the second bit line BL1 are amplified.

The voltage of the first plate line PL0 is returned to the L at a time t5. Simultaneously, the voltage applied to a select line SEL is brought to the H. Consequently, a first bit line selection transistor SET0 and a second bit line selection transistor SET1 are turned on to output the read voltages of the first bit line BL0 and the second bit line BL1 onto a data bus 2210.

The voltage applied to the precharge control line PCHG is brought to the H at a time t6, and the voltages applied to the activation signal line SAE and the select line SEL are respectively brought to the L. Thus the first precharge transistor PCT0 and the second precharge transistor PCT1 are turned on, so that the first bit line BL0 and the second bit line BL1 are grounded and the sense amplifier SA does not output read data.

Finally, the voltages applied to the first word line WL0 and the second word line WL1 are brought to the L at a time t7 to turn off the first selection transistor T0 and the second selection transistor T1.

FIG. 14 is a conceptual diagram for describing transition of state a ferroelectric capacitor. The horizontal axis indicates a voltage V [volt], and the vertical axis indicates polarization Pr [$\mu C/cm^2$]. As shown in FIG. 14, the relationship between the voltage V and the polarization Pr plots or represents a hysteresis curve H. The inclination of the hysteresis curve H is equivalent to the capacitance [q/V] of the ferroelectric capacitor.

In FIG. 14, the coordinates of a point A where the hysteresis curve H and a Pr axis (region of Pr>0) intersect, is defined as (0, p0). A straight line S1 is plotted which intersects, at an angle θ, a straight line formed by connecting the point A (0, p0) and a point B (Vcc, p0). The coordinates of a point C where the straight line S1 and an upward curve of the hysteresis curve H intersect, is defined as (v1, p1). The angle θ is determined according to the capacitance of each bit line. The V coordinate v1 of the point C coincides with a terminal-to-terminal voltage of the ferroelectric capacitor, and the difference Vcc-v1 between the V coordinates of the points B and C coincides with a bit line voltage. Thus when Pr>0 (when a stored value is given as '0'), a voltage V0 outputted onto the corresponding bit line is represented as Vcc-V1.

In FIG. 14, the coordinates of a point D where the hysteresis curve H and the Pr axis (region of Pr<0) intersect, is defined as (0, p2). A straight line S2 is plotted which intersects, at the angle θ, a straight line formed by connecting the point D (0, p2) and a point E (Vcc, p2). The coordinate of a point F where the straight line S2 and an upward curve of the hysteresis curve H intersect, is defined as (v2, p3). Even in this case, the V coordinate v2 of the point F coincides with a terminal-to-terminal voltage of the ferroelectric capacitor, and the difference Vcc-v2 between the V coordinates of the points E and F coincides with a bit line voltage. Thus when Pr<0 (when a stored value is given as '1'), a voltage V1 outputted onto the corresponding bit line is represented as Vcc-v2.

As is understood from FIG. 14, V0<V1, and the difference therebetween V1−V0 results in a read margin ΔV, V0, V1 and ΔV greatly depend on the angle θ, i.e., bit line capacitance Cbl.

FIG. 15 is one example of a graph showing the relationship between a ratio Cbl/Cs between the capacitance Cbl of each bit line and capacitance Cs of the ferroelectric capacitor, and the read margin ΔV. As is understood from FIG. 15, the read margin ΔV can be maximized by adjusting the ratio Cbl/Cs. Increasing the read margin ΔV makes it possible to improve the reliability of read data and enhance the yield of a FeRAM.

The capacitances Cbl of the first bit line B10 and the second bit line BL1 are made up of junction capacitances of the first selection transistor T0, the second selection transistor T1, the first precharge transistor PCT0 and the second precharge transistor PCT1 connected to the first bit line BL0 and the second bit line BL1, parasitic capacitances of the first bit line BL0 and the second bit line BL1, etc. However, the majority thereof results from the junction capacitances of the first selection transistor T0 and the second selection transistor T1. In the normal FeRAM, several hundreds of selection transistors are connected to one bit line, thereby increasing the capacitances Cbl of the first bit line BL0 and the second bit line BL1.

The ferroelectric memory using the ferroelectric capacitors as described above determines the stored states of the individual memory cells according to the voltages applied to the bit lines respectively connected thereto. It is therefore necessary to ensure the voltage margins upon data reading, i.e., optimize the capacitance of each bit line. The more the read margin increases, the more misreading decreases.

Variations essentially occur in the characteristics of individual ferroelectric capacitors formed on a wafer as physical necessity of a semiconductor device. Thus a test on electric characteristics of each manufactured ferroelectric memory by means of a high voltage or the like, a durability test for activating it by an arbitrary number of times, and a thermal characteristic test for confirming its operation under the condition of a temperature higher than a normal working temperature are carried out or overloads such as a high temperature, a high voltage, etc. are applied thereto to thereby accelerate the degradation of the ferroelectric memory. In this condition, a test for allowing defects of memory cells that will be deteriorated with time in proportion as it is used, to become manifest or obvious immediately after its manufacture, thereby carrying out the selection of each memory cell is performed, followed by selection of an initial defective memory cell or a memory cell found out as defective due to its deterioration with time.

However, problems arise in that, for example, any of the tests needs to have a very long test time, a severe load must be imposed on each memory cell to be selected, and an effective degradation accelerated test cannot be carried out due to a problem about a voltage or the like depending on the specifications of a device.

The present invention has been made to solve the foregoing problems. The present invention aims to provide a ferroelectric memory provided with a circuit structure capable of selecting a defective memory cell in a very short period of time without applying an excessive load to a memory cell to be selected, and a method of efficiently selecting a defective memory cell lying within the ferroelectric memory with low power consumption.

SUMMARY OF THE INVENTION

A summary of a typical one of the inventions disclosed in the present application will be described in brief as follows:

A ferroelectric memory according to the present invention includes a plurality of memory cell pairs placed in matrix form and for respectively storing complementary digitized data therein as polarization states of ferroelectric capacitors, a plurality of bit line pairs respectively connected to the memory cell pairs lying in the same column, a plurality of word line pairs and a plurality of plate lines for respectively voltage-controlling the memory cell pairs in column units to thereby output voltages corresponding to the complementary digitized data to their corresponding bit line pairs, sense amplifiers for respectively amplifying voltages outputted to the bit line pairs, and switch transistors respectively provided for bit lines of the bit line pairs to electrically connect a predetermined number of memory cells to the respective bit line of the bit line pairs and electrically disconnect them therefrom upon selection of defective memory cells.

According to the present invention, the capacitance of each bit line can be increased upon reading data into the bit line. Since a read margin for each defective memory cell becomes extremely small apparently with the increase in the capacitance of the bit line upon the data reading, a conventionally hard-to-detect defective memory cell that will be estimated to degrade with time according to its use, can be detected and selected. Since the ferroelectric memory has a simple structure wherein the switch transistors are simply added to a circuit, the above-described effect can be obtained under a reduction in the area of the memory.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
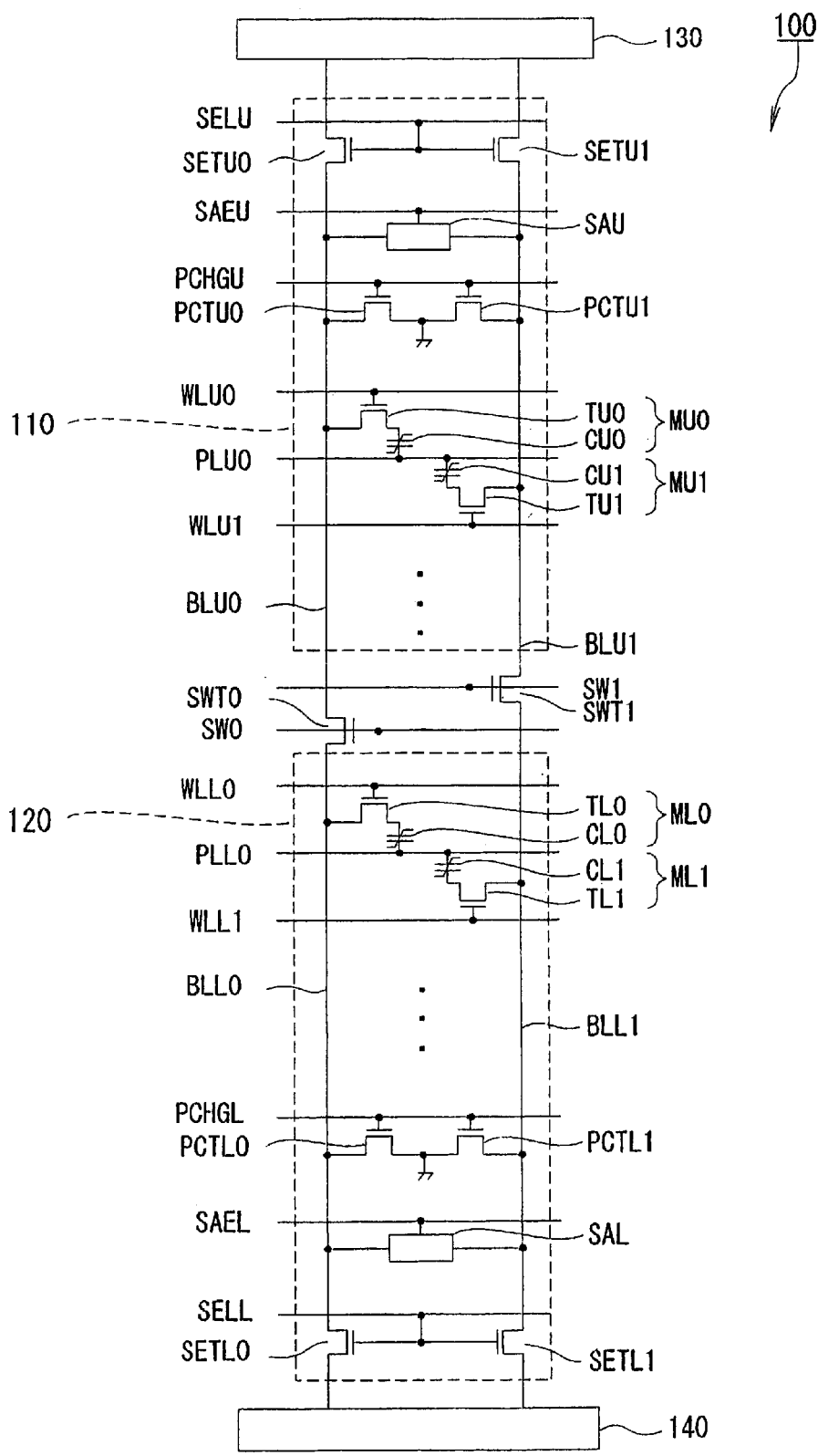
FIG. 1 is a circuit diagram illustrating a configuration of a ferroelectric memory according to a first embodiment.

Preferred embodiments of the present invention will hereinafter be described in detail with reference to the accompanying drawings. Incidentally, ones having the same functions are respectively identified by the same reference numerals in all the drawings for describing the embodiments of the present invention, and their repetitive description will be omitted.

Incidentally, respective components of structure, waveforms, etc. shown in the drawings are merely schematically illustrated to such an extent that the present invention can be understood. It should be understood that numerical conditions to be described later are merely illustrative examples.

<First Preferred Embodiment>

A ferroelectric memory according to a first embodiment of the present invention will hereinafter be described with a 2-transistor 2-capacitor/one-bit type ferroelectric memory as an illustrative example.

FIG. 1 is a circuit diagram typically showing a structure of a memory cell array, corresponding to one sequence of memory cell groups placed in matrix form, of the ferroelectric memory according to the present embodiment.

As shown in FIG. 1, the memory cell array of the ferroelectric memory 100 has a first memory cell block 110 (hereinafter also called "first block") and a second memory cell block 120 (hereinafter also called "second block") provided as two, a first switch transistor SWT0 and a second switch transistor SWT1.

In the present embodiment, the number of a plurality of first memory cell MU0, second memory cell MU1, . . . of the first block 110, and the number of a plurality of first memory cell ML0, second memory cell ML1, . . . of the second block 120 are regarded as identical to each other. Thus the numbers of memory cell transistors connected to first to fourth bit lines BLU0, BLU1, BLL0 and BLL1 become identical. Since most of the capacitances of the respective bit lines result from the junction capacitance of each memory cell transistor as described above, these bit lines become equal to one another in capacitance.

Thus a description will be made of an example in which the numbers of the memory cells in the respective blocks are respectively set as two in FIG. 1.

The first block 110 placed in each sequence includes a first memory cell MU0 and a second memory cell MU1 provided as a memory cell pair, a first precharge transistor PCTU0, a second precharge transistor PCTU1, a first bit line selection transistor SETU0, a second bit line selection transistor SETU1, a first sense amplifier SAU, and a first bit line (partial line) BLU0 and a second bit line BLU1 provided as a pair. On the other hand, the second block 120 placed in each sequence includes a first memory cell ML0 and a second memory cell ML1 provided as a memory cell pair, a third precharge transistor PCTL0, a fourth precharge transistor PCTL1, a third bit line selection transistor SETL0, a fourth bit line selection transistor SETL1, a second sense amplifier SAL, and a third bit-line (partial line) BLL0 and a fourth bit line BLL1 provided as a pair.

A first word line WLU0 and a second word line WLU1 provided as a pair, a first plate line PLU0, a precharge control line PCHGU, a first select line SELU and a first activation signal line SAEU are provided as control lines commonly used in the first block 110 placed in each sequence. On the other hand, a first word line WLL0 and a second word line WLL1 provided as a pair, a first plate line PLL0, a second precharge control line PCHGL, a second select line SELL and a second activation signal line SAEL are provided as control lines common to the second block 120 placed in each sequence. In addition, a first switch control line SW0 is provided as a control line for the first switch transistor SWT0 of each sequence, and a second switch control line SW1 is provided as a control line for the second switch transistor SWT1 thereof.

The first word line WLU0, the second word line WLU1 and the first plate line PLU0 of the first block 110 are arranged in parallel along a row direction of the memory cell array. The first word line WLU0 and the second word line WLU1 are disposed with two as one pair, and one plate line is placed between these two word lines. Similarly, the first word line WLL0, the second word line WLL1 and the fist plate line PLL0 of the second block 120 are arranged in parallel along the row direction of the memory cell array. The first word line WLL0 and the second word line WLL1 are disposed with two as one pair, and one plate line is placed between these two word lines.

The first bit line BLU0 and the second bit line BLU1 of the first block 110 are placed in parallel with two as one pair along a column direction of the memory cell array. Similarly, the third bit line BLL0 and the fourth bit line BLL1 of the second block 120 are placed in parallel with two as one pair along the column direction of the memory cell array.

The first memory cell MU0 and the second memory cell MU1 of the fist block 110 are respectively placed in positions where the first word line WLU0 and second word line WLU1, and the first bit line BLU0 and second bit line BLU1 intersect. The first memory cell MU0 and the second memory cell MU1 are respectively provided with a first MOS transistor TU0 and a second MOS transistor TU1, and a first ferroelectric capacitor CU0 and a second ferroelectric capacitor CU1 one by one. The first MOS transistor TU0 and the second MOS transistor TU1 respectively have gates connected to their corresponding word lines, drains connected to their corresponding bit lines, and sources connected to one ends of their corresponding ferroelectric capacitors CU0 and CU1. The other ends of the ferroelectric capacitors CU0 and CU1 are connected to their corresponding plate lines. Similarly, the first memory cell ML0 and the second memory cell ML1 of the second block 120 are respectively placed in positions where the first word line WLL0 and second word line WLL1, and the third bit line BLL0 and fourth bit line BLL1 intersect. The first memory cell ML0 and the second memory cell ML1 are respectively provided with a first MOS transistor TL0 and a second MOS transistor TL1, and a first ferroelectric capacitor CL0 and a second ferroelectric capacitor CL1 one by one. The first MOS transistor TL0 and the second MOS transistor TL1 respectively have gates connected to their corresponding word lines, drains connected to their corresponding bit lines, and sources connected to one ends of their corresponding ferroelectric capacitors CL0 and CL1. The other ends of the ferroelectric capacitors CL0 and CL1 are connected to their corresponding plate lines.

The first precharge control line PCHGU, the first select line SELU and the first activation signal SAEU of the first block 110 are placed so as to intersect the first bit line BLU0 and the second bit line BLU1. Similarly, the second precharge control line PCHGL, the second select line SELL and the second activation signal line SAEL of the second block 120 are disposed so as to intersect the third bit line BLL0 and the fourth bit line BLL1.

The first precharge transistor PCTU0 and the second precharge transistor PCTU1 of the first block 110 respectively have gates connected to the first precharge control line PCHGU, sources connected to their corresponding bit lines, and drains which are grounded. Similarly, the third precharge transistor PCTL0 and the fourth precharge transistor PCTL1 of the second block 120 respectively have gates connected to the second precharge control line PCHGL, sources connected to their corresponding bit lines, and drains which are grounded.

The first bit line selection transistor SETU0 and the second bit line selection transistor SETU1 of the fist block 110 respectively have gates connected to the first select line SELU, sources connected to their corresponding bit lines, and drains connected to a data bus 130. Similarly, the third bit line selection transistor SETL0 and the fourth bit line selection transistor SETL1 of the second block 120 respectively have gates connected to the second select line SELL, sources connected to their corresponding bit lines, and drains connected to a data bus 140.

When the first activation signal line SAEU is of an H level, the first sense amplifier SAU of the first block 110 is activated to amplify the difference in potential between the first bit line BLU0 and the second bit line BLU1. Similarly, when the second activation signal line SAEL is H in level, the second sense amplifier SAL of the second block 120 is activated to amplify the difference in potential between the third bit line BLL0 and the fourth bit line BLL1. In the present embodiment, the amplification of the potential difference by the first sense amplifier SAU-of the first block 110 is carried out where stored data are respectively read from the first memory cell MU0 and the second memory cell MU1 of the first block 110. On the other hand, the amplification of the potential difference by the second sense amplifier SAL of the second block 120 is carried out where stored data are respectively read from the first memory cell ML0 and the second memory cell ML1 of the second block 120. Incidentally, since the type of each of the first and second sense amplifiers SAU and SAL is not limited in the present embodiment, the description of its detailed internal configuration will be omitted.

The first switch transistor SWT0 has a gate connected to the first switch control line SW0, one of a source or a drain thereof, which is connected to its corresponding bit line of the first block 110, and the other thereof connected to its corresponding bit line of the second block 120. Similarly, the second switch transistor SWT1 has a gate connected to the second switch control line SW1, one of a drain or a source, which is connected to its corresponding bit line of the fist block 110, and the other thereof connected to its corresponding bit line of the second block 120.

Figure 2:
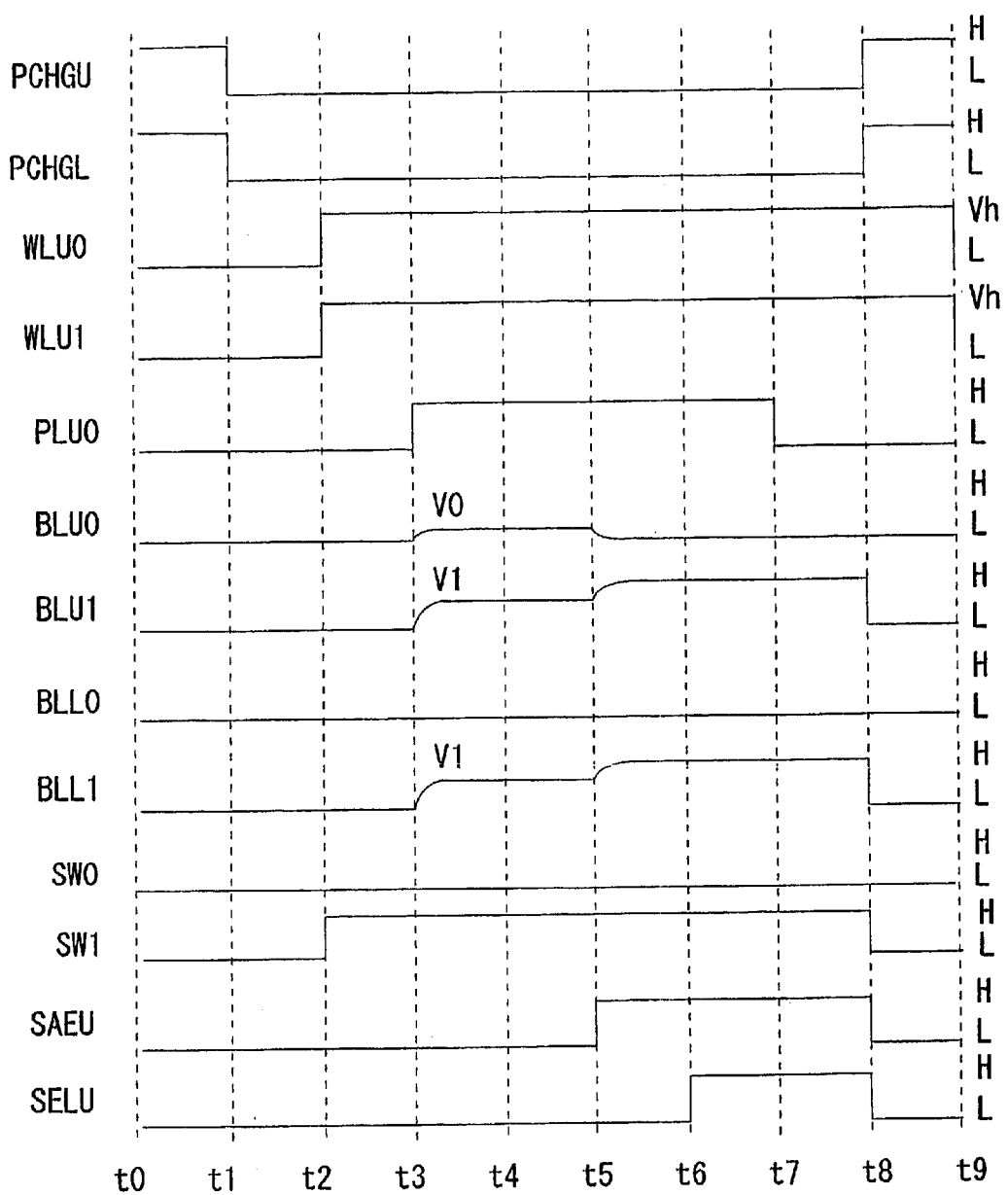
FIG. 2 is a timing chart showing the operation of the ferroelectric memory according to the first embodiment.

A read operation example 1 in a selection mode for selecting a defective or fail memory cell in the ferroelectric memory 100 provided with the circuit structure shown in FIG. 1 will next be explained by using a timing chart shown in FIG. 2. A description will be made here of, as one example, a case in which the data stored in each of the first memory cell MU0 and the second memory cell MU1 is read to select whether each memory cell is defective. In FIG. 2, 'L' indicates a ground voltage, and 'H' indicates a source voltage Vcc, respectively. 'Vh' indicates a voltage which is higher than the source voltage Vcc and is increased by about a threshold voltage Vt of each of the first and second MOS transistors TU0 and TU1 of the memory cells.

Let's first consider where "1" indicative of one of complementary digitized or binary data is written into a memory cell to be selected, i.e., the MU1 herein. The other complementary data "0" is written into the MU0. Here, "1" indicates the side inverted in polarization at a ferroelectric capacitor upon reading.

In an initial state (at a time t0), the voltages applied to the first switch control line SW0 and the second switch control line SW1 are respectively of the L level.

Upon reading the data stored in the first memory cell MU0 and the second memory cell MU1 of the memory cell pairs, the voltages applied to the first precharge control line PCHGU and the second precharge control line PCHGL are respectively brought to the L level at a time t1. Thus, since the first precharge transistor PCTU0, second precharge transistor PCTU1, third precharge transistor PCTL0 and fourth precharge transistor PCTL1 are turned off, the first through fourth bit lines BLU0, BLU1, BLL0 and BLL1 are respectively brought to a floating state.

Next, the first word line WLU0 and the second word line WLU1 are respectively brought to the Vh level at a time t2. Thus the first MOS transistor TU0 and the second MOS transistor TU1 of the first memory cell MU0 and the second memory cell MU1 are turned on so that one terminals of the first ferroelectric capacitor CU0 and the second ferroelectric capacitor CU1 are respectively rendered conductive to the first bit line BLU0 and the second bit line BLU1. Further, when the second switch control line SW1 is brought to the H level, the second bit line BLU1 and the fourth bit line BLL1 are electrically connected to each other. The reason why the first word line WLU0 and the second word line WLU1 are respectively brought to the Vh level other than the H level, is that the output voltages (drain voltages) of the first MOS transistor TU0 and second MOS transistor TU1 are reduced by Vt as compared with their input voltages (gate voltages).

Subsequently, the first plate line PLU0 is brought to the H level at a time t3. Consequently, the voltage applied to the plate line PLU0 is applied to the first bit line BLU0 and the second bit line BLU1 through the first ferroelectric capacitor CUP, the second ferroelectric capacitor CU1, and the first MOS transistor TUO and the second MOS transistor TU1. Therefore, a read voltage (V0 or V1) corresponding to the direction of polarization is developed in both bit lines, i.e., the first bit line BLU0 and the second bit line BLU1 electrically connected to the fourth bit line BLL1. Since the second switch transistor SWT1 is turned on as described above, the second bit line BLU1 is connected to the second bit line BLU1 and the fourth bit line BLL1. Accordingly, the parasitic capacitances of the second bit line BLU1 and the fourth bit line BLL1 sufficiently increase according to the plurality of selection transistors connected to the second bit line BLU1 and the fourth bit line BLL1.

At a time t5, the first activation signal line SAEU is brought to the H level to activate the first sense amplifier SAU. Thus the voltages applied to the first bit line BLU1, the second bit line BLU1 and the fourth bit line BLL1 are amplified.

Subsequently, the first select line SELU is brought to the H level at a time t6. Consequently, the first bit line selection transistor SETU0 and the second bit line selection transistor SETU1 are turned on so that the voltages of the first bit line BLU0, the second bit line BLU1 and the fourth bit line BLL1 are outputted to the data bus 130.

Next, the voltage applied to the fist plate line PLU0 is returned to the L level at a time t7.

At a time t8, the voltages applied to the first precharge control line PCHGU and the second precharge control line PCHGL are respectively returned to the H level, and the voltages applied to the first activation signal line SAEU and the first select line SELU are respectively brought to the L level. Thus the first precharge transistor PCTU0, the second precharge transistor PCTU1, the third precharge transistor PCTL0 and the fourth precharge transistor PCTL1 are turned on, so that the first bit line BLU0, the second bit line BLU1, the third bit line BLL0 and the fourth bit line BLL1 are grounded and no read data are outputted. At the time t8 as well, the second switch control line SWT1 is returned to the L level. Thus, since the second switch transistor SWT1 is turned off, the second bit line BLU1 and the fourth bit line BLL1 are electrically disconnected from each other.

At a time t9, the voltages on the first word line WLU0 and the second word line WLU1 are respectively brought to the L level to turn off the first MOS transistor TU0 and the second MOS transistor TU1. Thus the read operation is completed.

According to the configuration of the present invention, the above-described read voltages are detected to select the corresponding defective memory cell.

Incidentally, the operation of reading stored data from other memory cells (no shown) of the first block 110 is substantially identical to the operation of reading the data from the above-described memory cell MU1. Even if each block includes three or more memory cells, the operation of reading data from each of the memory cells is carried out in the same manner as described above.

On the other hand, when it is desired to read stored data from either one of the first memory cell ML0 and the second memory cell ML1 of the second block 120, the second switch transistor SWT1 is turned on (see t2 in FIG. 2) and thereafter the second sense amplifier SAL of the second block 120 is activated (this being equivalent to the time t5) to amplify the read data. The post-amplification data is outputted to the data bus 140 through the third bit line selection transistor SETL0 and the fourth bit line selection, transistor SETL1 (this being equivalent to the time t6). Namely, the sense amplifier (sense amplifier connected to each memory cell to be read after the second switch transistor SWT1 has been turned on) corresponding to the memory cell to be read is used to amplify the read data.

When it is desired to use the ferroelectric memory according to the present embodiment in a normal mode, the first switch control line SW0 and the second switch control line SW1 are always kept in an L state, whereby the writing or reading of data can be carried out as usual.

Thus the ferroelectric memory 100 according to the present embodiment has a circuit structure capable of selecting a defective memory cell that will be degraded with time according to its use. When it is desired to read stored data from a transistor of a memory cell to be selected and select it, for instance, the first switch transistor SWT0 and the second switch transistor SWT1 are selectively and exclusively turned on to electrically connect the first bit line BLU0 and the third bit line BLL0, and the second bit line BLU1 and the fourth bit line BLL1 respectively. It is therefore possible to sufficiently increase the capacitance of each bit line upon reading (see the time t3). Thus a reading margin for each defective memory cell that will be degraded with time according to the use thereof, can be extremely reduced apparently. Therefore, the conventional difficult selection of each defective memory cell that will be degraded with time according to the use thereof, can easily be carried out in a short time in accordance with a degradation accelerated test or the like without an excessive load being imposed on each memory cell to be selected.

A logical background for selecting each defective memory cell that will be degraded with time according to its use, will now be described with reference to FIGS. 3 and 4 according to the configuration of the first embodiment.

Figure 3:
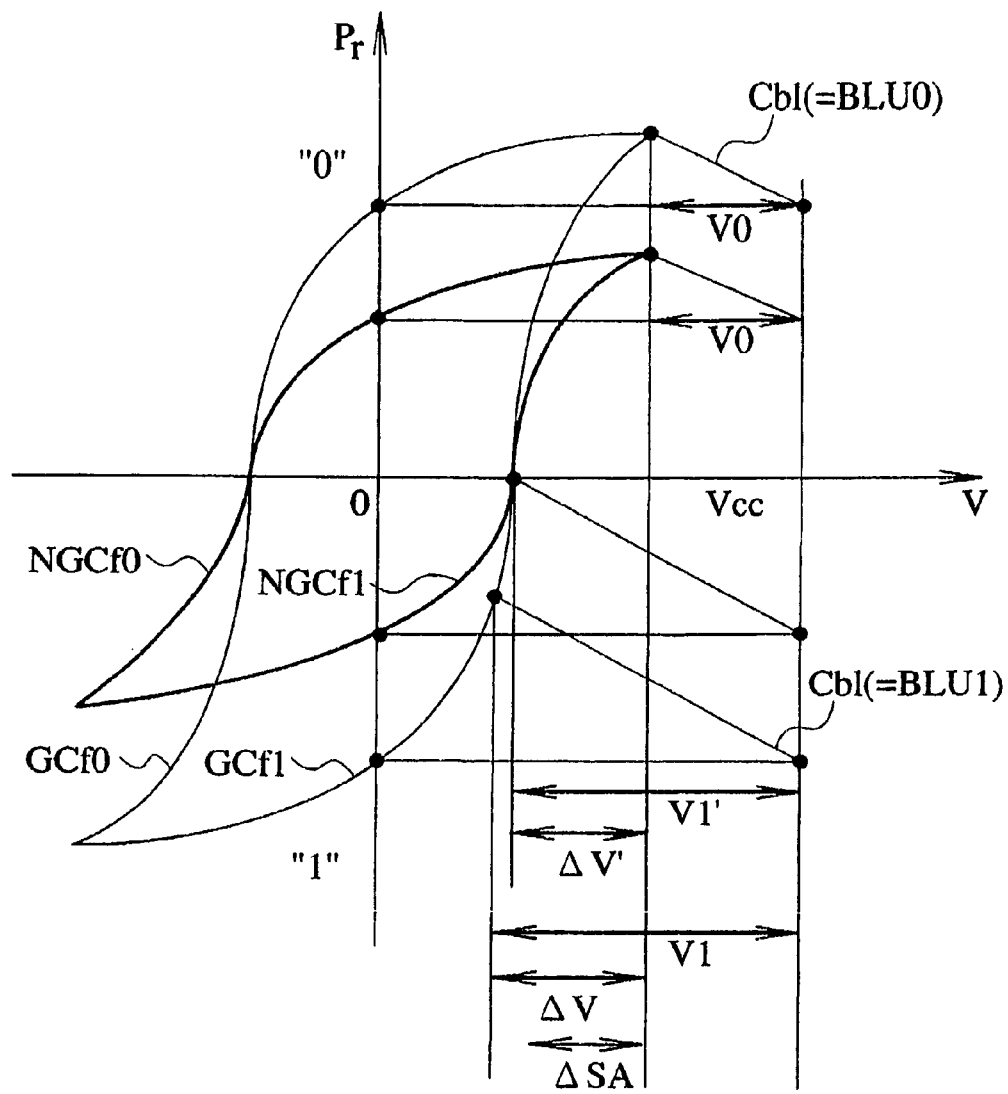
FIG. 3 is a conceptual diagram depicting the manner of state shifts of the ferroelectric memory and read voltages thereof.
Figure 4:
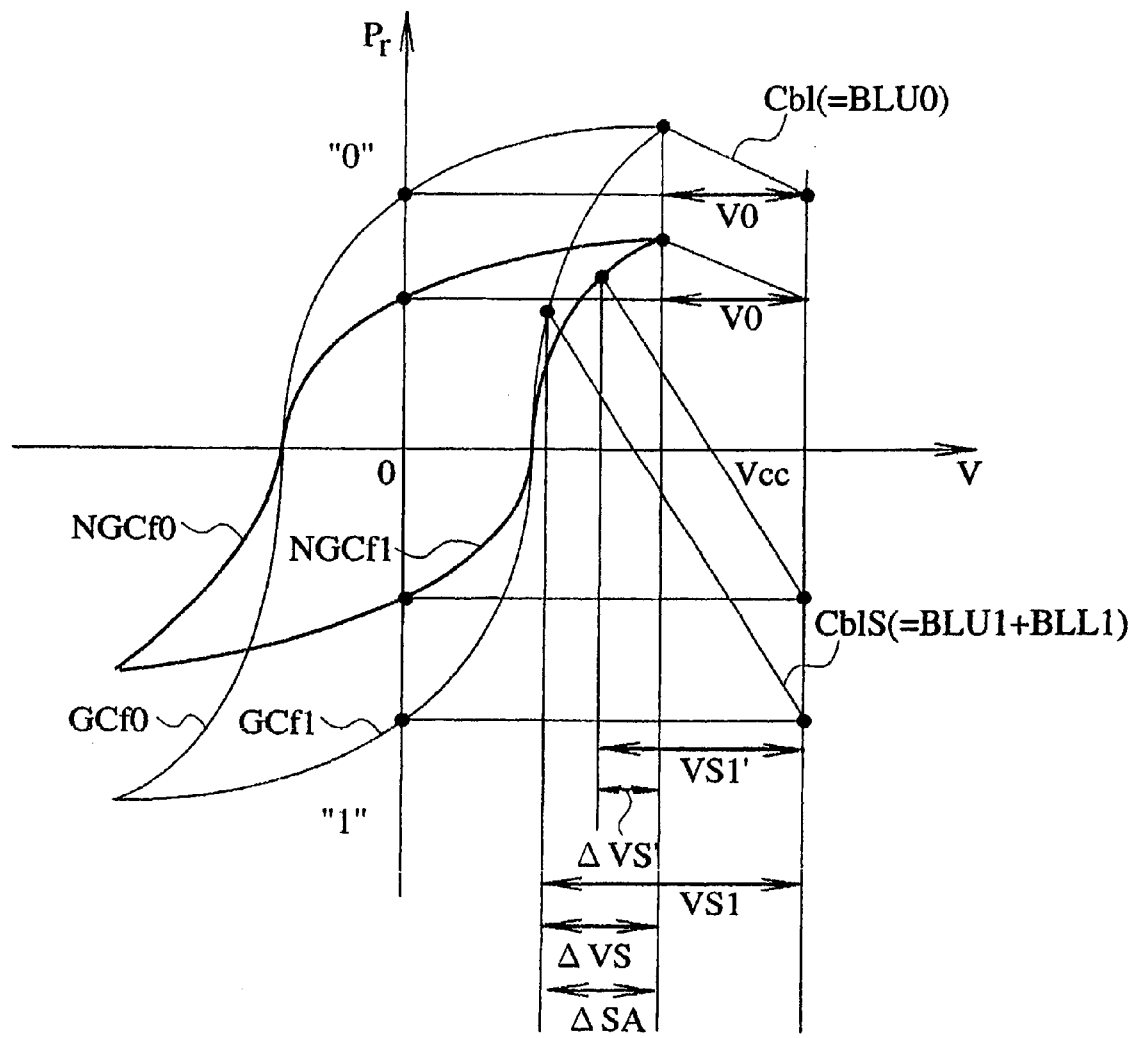
FIG. 4 is a conceptual diagram showing the manner of state shifts of the ferroelectric memory and read voltages used in a selection mode.

FIGS. 3 and 4 are respectively graphs showing hysteresis characteristics (GCf0 and GCf1) of a ferroelectric capacitor having satisfactory characteristics, hysteresis characteristics (NGCf0 and NGCf1) of a ferroelectric capacitor degraded in characteristic due to its defect or the like, and capacitance straight lines (Cbl and CblS) of bit lines. The horizontal axis indicates a voltage V [Volt], and the vertical axis indicates polarization Pr [$\mu C/cm^2$], respectively. As evident from both drawings, the difference between the graphs due to the characteristic degradation of the ferroelectric capacitor, i.e., the difference between read voltages is hard to appear on each bit line on the polarization "0" side in general. This is apt to appear on each bit line on the polarization "1" side.

FIG. 3 is a graph showing the manner of read voltages in a normal mode of the ferroelectric memory described in the first embodiment of the present invention. As is apparent from this graph, the difference between a read margin ΔV for a satisfactory ferroelectric capacitor and a read margin ΔV' for a ferroelectric capacitor including a defect is extremely slight in the normal mode. Thus, since the read margin ΔV' for the ferroelectric capacitor that has potential or underlying defects and will be degraded in characteristic with time according to its use, exceeds a voltage margin of the corresponding sense amplifier, which is indicated by ΔSA, the sense amplifier is activated. Thus when the ferroelectric capacitor is regarded as the ferroelectric memory, it seems to be normally activated while containing underlying defects. However, there is a very high possibility that the deterioration of the ferroelectric capacitor will become manifest with the repetition of write and read operations, and some failure in operation will occur.

FIG. 4 is a graph showing the manner of read voltages in a selection mode of the ferroelectric memory according to the first embodiment of the present invention. A description thereof will be made while referring to FIG. 1. By turning on the second switch transistor SWT1 upon data reading, the second bit line (partial line) BLU1 and fourth bit line BLL1 on the polarization "1" side are connected to increase the capacitance, i.e., make the inclination of the capacitance straight line CblS steep, whereby the difference between a voltage margin ΔVS of a satisfactory ferroelectric capacitor and a voltage margin ΔVS' of a ferroelectric capacitor which has underlying defects and whose degradation is accelerated with time according to its use, can be rendered large. In this case in particular, ΔVS' becomes smaller than the voltage margin ΔSA of the sense amplifier. Namely, since ΔVS'<ΔSA, the sense amplifier does not operate. Thus each ferroelectric memory cell that will be made defective in the future, which could not be selected as an initial failure since its defect was not made evident, can be selected with, for example, the operation or non-operation of the corresponding sense amplifier as an index. However, the construction of the present invention is not limited to it. For instance, another means for carrying out the direct detection of a voltage of ΔVS', etc. is suitably selected and a defective ferroelectric memory cell may be selected.

Figure 5:
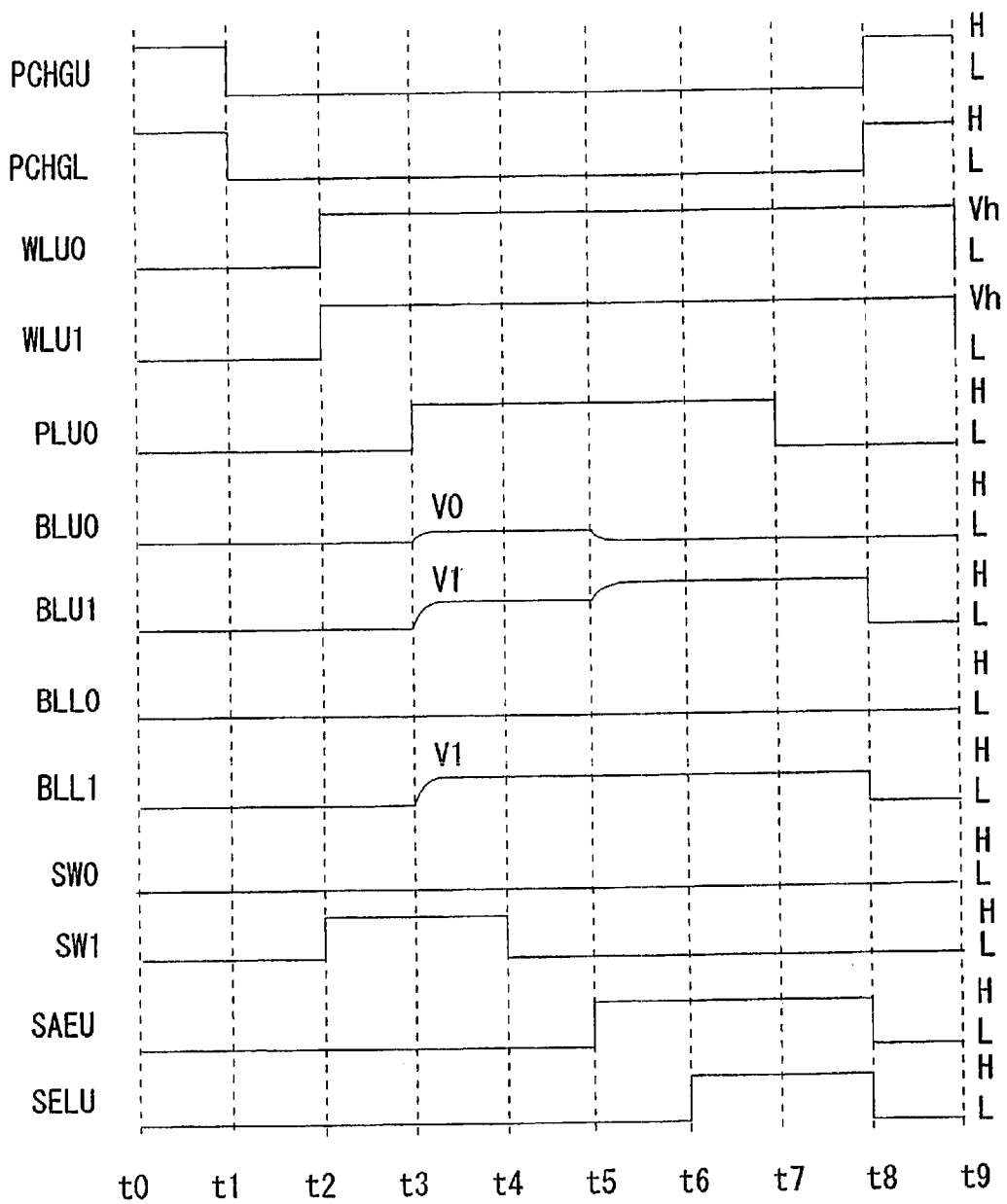
FIG. 5 is a timing chart showing another example of the operation of the ferroelectric memory according to the first embodiment.

Another operation example 2 of the ferroelectric memory according to the first embodiment will be explained with reference to FIG. 5. FIG. 5 is a timing chart for describing the operation example 2 of the ferroelectric memory according to the first embodiment. The operation to be described by the operation example 2 is different from the operation described according to the timing chart shown in FIG. 2, i.e., the operation example 1 of the first embodiment in that the operation for turning off the second switch transistor SWT1 at a time t4 in FIG. 5 to thereby electrically isolate the second bit line BLU1 and the fourth bit line BLL1 electrically connected to each other is added. Thus the capacitance at the amplification of data by the corresponding sense amplifier (see a time t5) can be set to one-half the capacitance at data reading. Accordingly, the first sense amplifier SAU can be reduced in power consumption.

In the present embodiment as described above, the number of the memory cells in the first block 110 and the number of the memory cells in the second block 120 are rendered identical and set to 2 respectively. However, the numbers of the memory cells in these blocks 110 and 120 may not be made identical and may be three or more. If the ratio between the number of the memory cells in the first block 110 and the number of the memory cells in the second block 120 is set as 1:2, for example, then the ratio between the capacitance of each of the bit lines BLU0 and BLU1 of the first block 110 and that of each of the bit lines BLL0 and BLL1 of the second block 120 becomes approximately 1:2 (most of the capacitances of the bit lines correspond to the junction capacitance of each memory cell transistor as described above). Thus power consumed or used up where the data are read from the first memory cell MU0 and the second memory cell MU1 lying within the first block 110, reaches about one-third the conventional power consumption. Further, power consumed where the data are read from the first memory cell ML0 and the second memory cell ML1 lying within the second block 120, is brought to about two-third the conventional power consumption. Accordingly, data high in read frequency are respectively stored in the first memory cell MU0 and the second memory cell MU1 in the first block 110, and data low in read frequency are respectively stored in the fist memory cell ML0 and the second memory cell ML1 in the second block 120. Consequently, the power consumption can further be reduced as compared with the case where the numbers of the memory cells in the blocks 110 and 120 are identical. When a program storage area and a data storage area are provided within one FeRAM, for example, power consumption is reduced if the area in which the number of memory cells per bit line is low, is set as the program storage area and the area in which the number thereof is great, is set as the data storage area. This is because the program storage area generally becomes high in access frequency.

Second Preferred Embodiment

A ferroelectric memory according to a second embodiment of the present invention will hereinafter be described with a 2-transistor 2-capacitor/one-bit type ferroelectric memory as an illustrative example.

The present embodiment is different from the first embodiment in that sense amplifiers, etc. of respective blocks are used in common.

Figure 6:
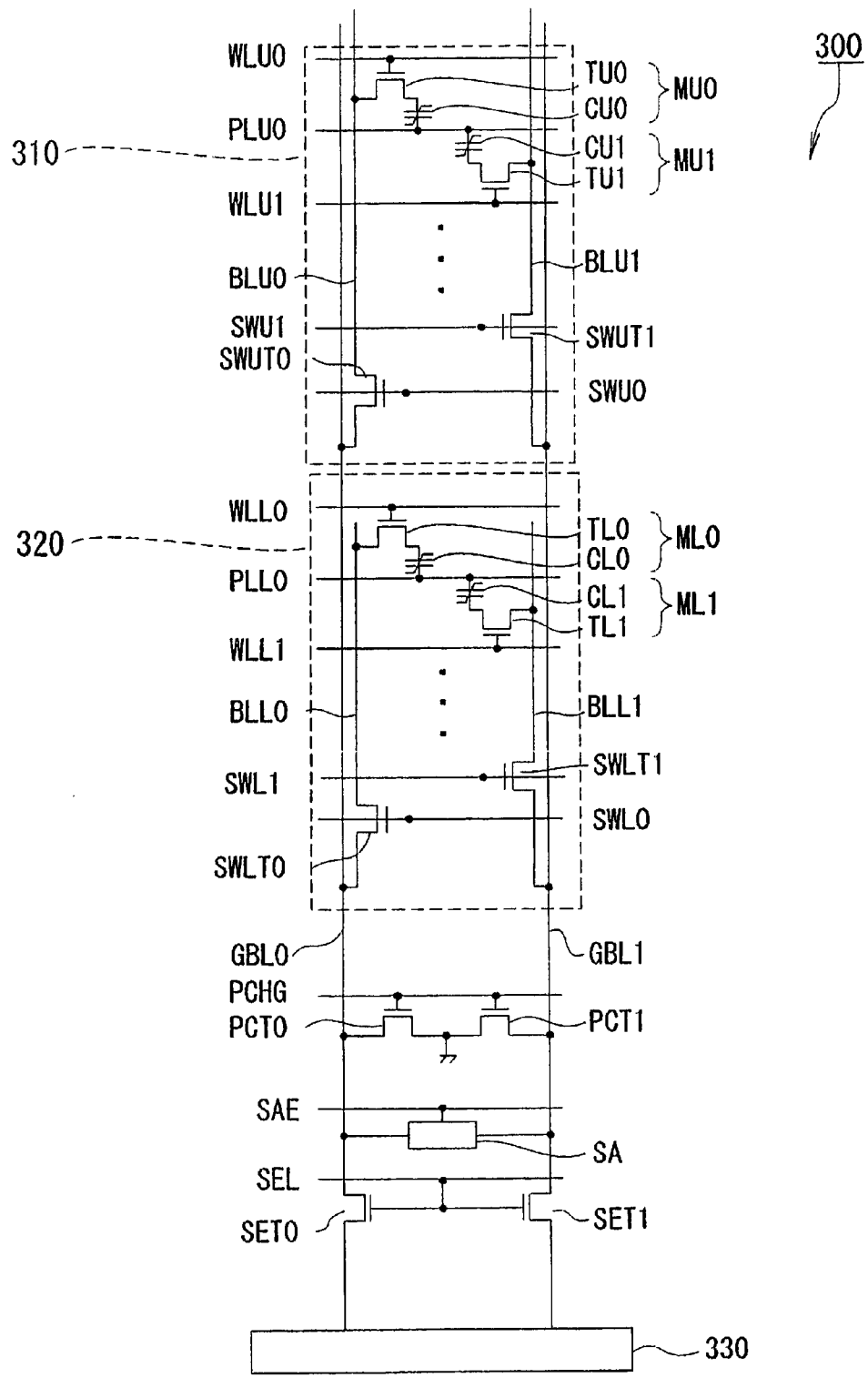
FIG. 6 is a circuit diagram illustrating a configuration of a ferroelectric memory according to a second embodiment.

FIG. 6 is a circuit diagram showing a structure equivalent to one sequence, of a memory cell array of the ferroelectric memory according to the present embodiment.

As shown in FIG. 6, a memory cell array of a ferroelectric memory 300 comprises two first and second memory cell blocks 310 and 320, a first precharge transistor PCT0, a second precharge transistor PCT1, a sense amplifier SA, a first bit line selection transistor SET0, a second bit line selection transistor SET1, a first global bit line GBL0, and a second global bit line GBL1, which are provided for each sequence. The first memory cell block 310 includes a first memory cell MU0 and a second memory cell MU1 and is further provided with a first switch transistor SWUT0, a second switch transistor SWUT1, a first bit line (partial line) BLU0, and a second bit line BLU1. Similarly, the second memory cell block 320 includes a first memory cell ML0 and a second memory cell ML1 and is provided with a third switch transistor SWLT0, a fourth switch transistor SWLT1, a third bit line (partial line) BLL0, and a fourth bit line BLL1.

In the present embodiment, the numbers of the first memory cell MU0, second memory cell MU1, . . . in the first memory cell block 310, and the numbers of the first memory cell ML0, second memory cell ML1, . . . in the second memory cell block 320 are considered as identical in the present embodiment. Thus these bit lines become identical in capacitance.

A first word line WLU0, a second word line WLU1, a first plate line PLU0, a first switch control line SWU0 and a second switch control line SWU1 are provided as control lines common to the first memory cell block 310 placed in each sequence. Similarly, a first word line WLL0, a second word line WLL1, a first plate line PLL0, a third switch control line SWL0 and a fourth switch control line SWL1 are provided as control lines common to the second memory cell block 320 placed in each sequence. A precharge control line PCHG, an activation signal line SAE and a select line SEL are provided as control lines common to the first precharge transistor PCT0, the second precharge transistor PCT1, the sense amplifier SA, the first bit line selection transistor SET0, and the second bit line selection transistor SET1 placed in each sequence.

The first word line WLU0, the second word line WLU1 and the first plate line PLU0 common to each first memory cell block 310 are arranged in parallel along a row direction of the memory cell array. The first word line WLU0 and the second word line WLU1 are disposed with two as one pair, and one plate line is placed between these two word lines. Similarly, the first word line WLL0, the second word line WLL1 and the fist plate line PLL0 common to each second memory cell block 320 are also arranged in parallel along the row direction of the memory cell array. The first word line WLL0 and the second word line WLL1 are disposed with two as one pair, and one plate line is placed between these two word lines.

The first bit line BLU0 and the second bit line BLU1 of the first memory cell block 310 are placed in parallel with two as one pair along a column direction of the memory cell array. Similarly, the third bit line BLL0 and the fourth bit line BLL1 of the second memory cell block 320 are also placed in parallel with two as one pair along the column direction of the memory cell array.

The first global bit line GBL0 and the second global bit line GBL1 are respectively connected to the first bit line BLU0 and the second bit line BLU1 of the first memory cell block 310 through the first switch transistor SWUT0 and the second switch transistor SWUT1. Further, they are respectively connected to the third bit line BLL0 and the fourth bit line BLL1 of the second memory cell block 320 through the third switch transistor SWLT0 and the fourth switch transistor SWLT1. The gates of the first switch transistor SWUT0 and the second switch transistor SWUT1 are respectively connected to the first switch control line SWU0 and the second switch control line SWU1. The gates of the third switch transistor SWLT0 and the fourth switch transistor SWLT1 are respectively connected to the third switch control line SWL0 and the fourth switch control line SWL1.

The first memory cell MU0 and the second memory cell MU1 of the first memory cell block 310 are respectively placed in positions where the first word line WLU0 and the second word line WLU1, and the first bit line BLU0 and the second bit line BLU1 intersect respectively. The first memory cell MU0 and the second memory cell MU1 are respectively provided with a first MOS transistor TU0, a second MOS transistor TU1, a first ferroelectric capacitor CU0, and a second ferroelectric capacitor CU1 one by one. The first MOS transistor TU0 and the second MOS transistor TU1 respectively have gates connected to their corresponding word lines, drains connected to their corresponding bit lines, and sources connected to one ends of their corresponding first and second ferroelectric capacitors CU0 and CU1. The other ends of the first and second ferroelectric capacitors CU0 and CU1 are connected to their corresponding plate lines. Similarly, the first memory cell ML0 and the second memory cell ML1 of the second memory cell block 320 are respectively placed in positions where the first word line WLL0 and second word line WLL1, and the third bit line BLL0 and fourth bit line BLL1 intersect respectively. The first memory cell ML0 and the second memory cell ML1 are respectively provided with a first MOS transistor TL0 and a second MOS transistor TL1, and a first ferroelectric capacitor CL0 and a second ferroelectric capacitor CL1 one by one. The first MOS transistor TL0 and the second MOS transistor TL1 respectively have gates connected to their corresponding word lines, drains connected to their corresponding bit lines, and sources connected to one ends of their corresponding first and second ferroelectric capacitors CL0 and CL1. The other ends of the first and second ferroelectric capacitors CL0 and CL1 are connected to their corresponding plate lines.

The first precharge transistor PCT0 and the second precharge transistor PCT1 respectively have gates connected to the precharge control line PCHG, sources connected to their corresponding global bit lines, and drains which are grounded.

The first bit line selection transistor SET0 and the second bit line selection transistor SET1 respectively have gates connected to the select line SEL, sources connected to their corresponding global bit lines, and drains connected to a data bus 330.

When a signal SAE is high in level, the sense amplifier SA is activated to amplify voltages on the global bit lines GBL0 and GBL1. Incidentally, since the type of the sense amplifier SA is not limited in the present embodiment, the description of a detailed internal configuration will be omitted.

Figure 7:
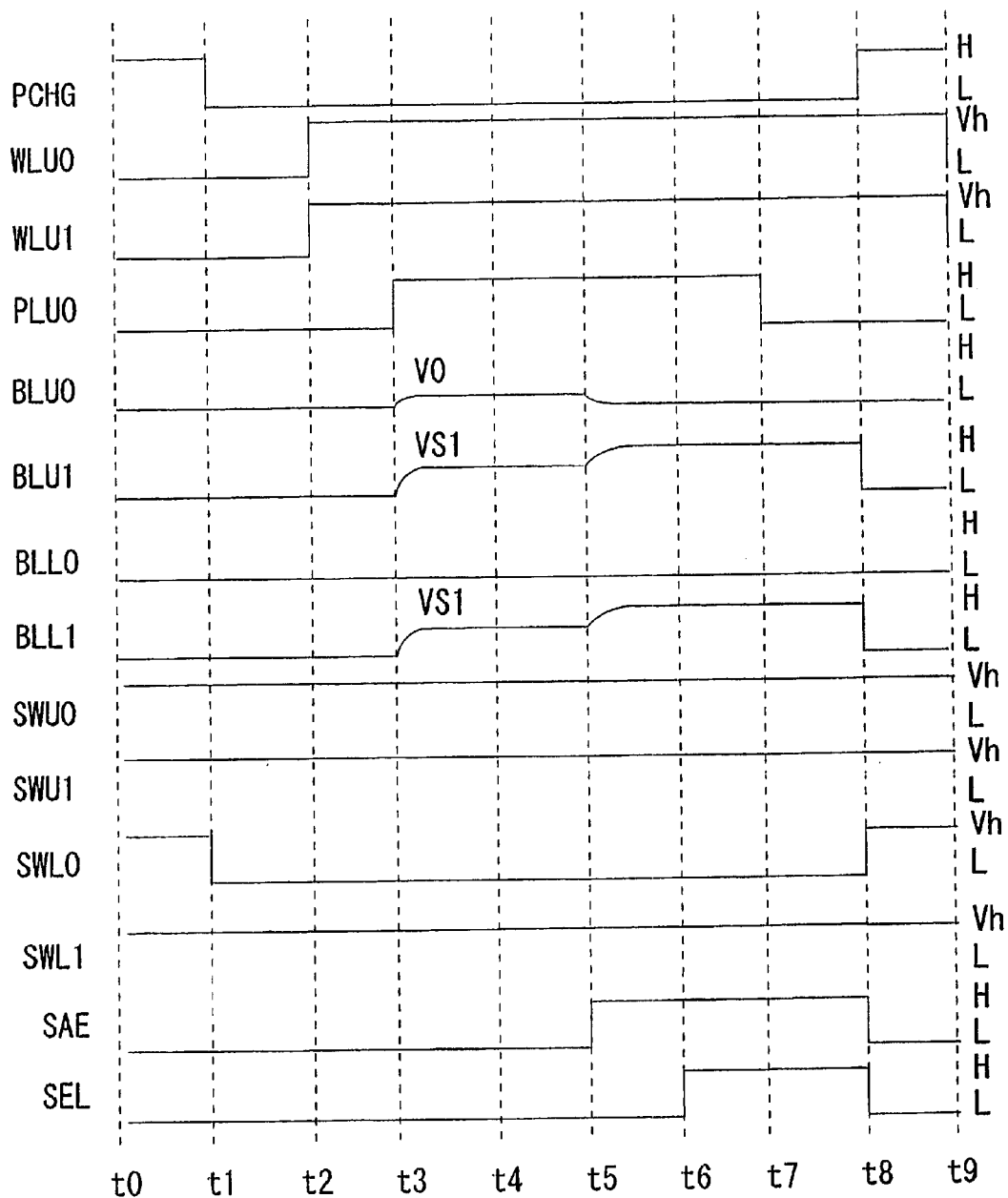
FIG. 7 is a timing chart depicting the operation of the ferroelectric memory according to the second embodiment.

A read operation example 1 in a selection mode for selecting a defective or fail memory cell in the ferroelectric memory 300 provided with the circuit structure shown in FIG. 6 will next be explained by using a timing chart shown in FIG. 7. A description will be made here of, as one example, a case in which the data stored in each of the first memory cell MU0 and the second memory cell MU1 is read to select whether each memory cell is defective. In FIG. 7, 'L' indicates a ground voltage, and 'H' indicates a source voltage Vcc, respectively. 'Vh' indicates a voltage which is lower than the source voltage Vcc and is increased by about a threshold voltage Vt of each of the first and second MOS transistors TU0 and TU1 of the memory cells.

Let's consider where "1" indicative of one of complementary digitized or binary data is written into a memory cell to be selected, i.e., the MU1 herein. "0" indicative of the other complementary data is written into the MU0. Here, "1" indicates the side inverted in polarization at a ferroelectric capacitor upon reading.

In an initial state (at a time t0), the voltages applied to the first switch control line SWU0, the second switch control line SWU1, the third switch control line SWL0 and the fourth switch control line SWL1 are respectively given as the Vh level. Thus the first bit line BLU0 and the third bit line BLL0, and the second bit line BLU1 and the fourth bit line BLL1 are respectively connected to the first precharge transistor PCT0 and the second precharge transistor PCT1 by means of the first switch transistor SWUT0, the second switch transistor SWUT1, the third switch transistor SWLT0 and the fourth switch transistor SWLT1, where they are precharged.

Upon reading the data stored in the memory cells MU0 and MU1 to be selected, the voltages applied to the precharge control line PCHG and the third switch control line SWL0 are respectively brought to the L level at a time t1. Thus, since the first precharge transistor PCT0 and the second precharge transistor PCT1 are turned off, the first global bit line GBL0 and the second global bit line GBL1 are respectively brought to a floating state. Further, since the third switch transistor SWLT0 is turned off, the third bit line BLL0 is separated from the second global bit line GBL1.

Next, the first word line WLU0 and the second word line WLU1 are respectively brought to the Vh level at a time t2. Thus the first MOS transistor TU0 and the second MOS transistor TU1 of the first memory cell MU0 and the second memory cell MU1 are turned on so that one terminals of the first ferroelectric capacitor CU0 and the second ferroelectric capacitor CU1 are respectively rendered conductive to the first bit line BLU0 and the second bit line BLU1. The reason why the first word line WLU0 and the second word line WLU1 are respectively brought to the Vh level other than the H level, is that the output voltages (drain voltages) of the first MOS transistor TU0 and second MOS transistor TU1 are reduced by Vt as compared with their input voltages (gate voltages).

Subsequently, the first plate line PLU0 is brought to the H level at a time t3. Consequently, the voltage applied to the first plate line PLU0 is applied to the first bit line BLU0 and the second bit line BLU1 through the first ferroelectric capacitor CU0, the second ferroelectric capacitor CU1, and the first MOS transistor TU0 and the second MOS transistor TU1. Therefore, a read voltage of V0 is developed in the first bit line BLU0, and a read voltage of VS1 is developed in the second bit line BLU1. Since the second bit line BLU1 and the fourth bit-line BLL1 remain connected to the second global bit line GBL1 as described above, the second global bit line GBL1 becomes sufficiently large in parasitic capacitance. Therefore, a read margin $\Delta V = VS1 - V0$ also becomes great sufficiently.

At a time t5, the activation signal line SAE is brought to the H level to activate the sense amplifier SA. Thus the voltages applied to the first global bit line GBL0 and the second global bit line GBL1 are amplified.

Subsequently, the select line SEL is brought to the H level at a time t6. Consequently, the first bit line selection transistor SET0 and the second bit line selection transistor SET1 are turned on so that the voltages of the first global bit line GBL0 and the second global bit line GBL1 are outputted to the data bus 330.

Next, the voltage on the fist plate line PLU0 is returned to the L level at a time t7.

At a time t8, the voltage applied to the precharge control line PCHG is returned to the H level, and the voltages applied to the activation signal line SAE and the select line SEL are respectively brought to the L level. Consequently, the first precharge transistor PCT0 and the second precharge transistor PCT1 are turned on so that the first global bit line CBL0, the second global bit line GBL1 are grounded and no read data are outputted from the sense amplifier SA. At the time t8 as well, the third switch control line SWL0 is returned to the Vh level. Thus, since the third switch transistor SWLT0 is turned on, the third bit line BLL0 and the fourth bit line BLL1 are connected to the first global bit line GBL0.

At a time t9, the voltages on the first word line WLU0 and the second word line WLU1 are respectively brought to the L level to turn off the first MOS transistor TU0 and the second MOS transistor TU1. Thus the read operation is completed.

By detecting such read potentials, the corresponding defective memory cell is selected.

Incidentally, the operation of reading stored data from other memory cells (no shown) of the first memory cell block 310 is also substantially identical to the operation of reading the data from the above-described memory cell MU1. Even if each block includes three or more memory cells, the operation of reading data from each of the memory cells is carried out in the same manner as described above.

On the other hand, when it is desired to read stored data from the first memory cell ML0 and the second memory cell ML1 of the second memory cell block 320, the first switch transistor SWUT0 and the second switch transistor SWUT1 is turned off after the charging of the first global bit line GBL0 and the second global bit line GBL1. Namely, the first bit line BLU0 and second bit line BLU1 of the first memory cell block 310 are respectively disconnected from the first global bit line GBL0 and the second global bit line GBL1 upon amplification of the read data.

When it is desired to use the ferroelectric memory according to the present embodiment in a normal mode, only the switch transistors (SWUT0 and SWUT1 or SWLT0 and SWLT1) on the accessing side are respectively held in the 'H' state, thereby making it possible to perform the writing or reading of data as usual.

Thus each ferroelectric memory cell that will be made defective with time according to its use, which could not be selected as an initial failure since its defect was not made evident so far, can be selected with, for example, the operation or non-operation of the corresponding sense amplifier as an index. However, the construction of the present invention is not limited to it. For instance, another means for carrying out the direct detection of voltages of V0 and VS1 at the time t3 of the timing chart shown in FIG. 7, etc. is suitably selected and thereby a defective ferroelectric memory cell may be selected.

According to the ferroelectric memory according to the present embodiment in addition to the above, since the sense amplifier and the like are used in common, the whole area of integrated circuit can be reduced as compared with the first embodiment referred to above.

Figure 8:
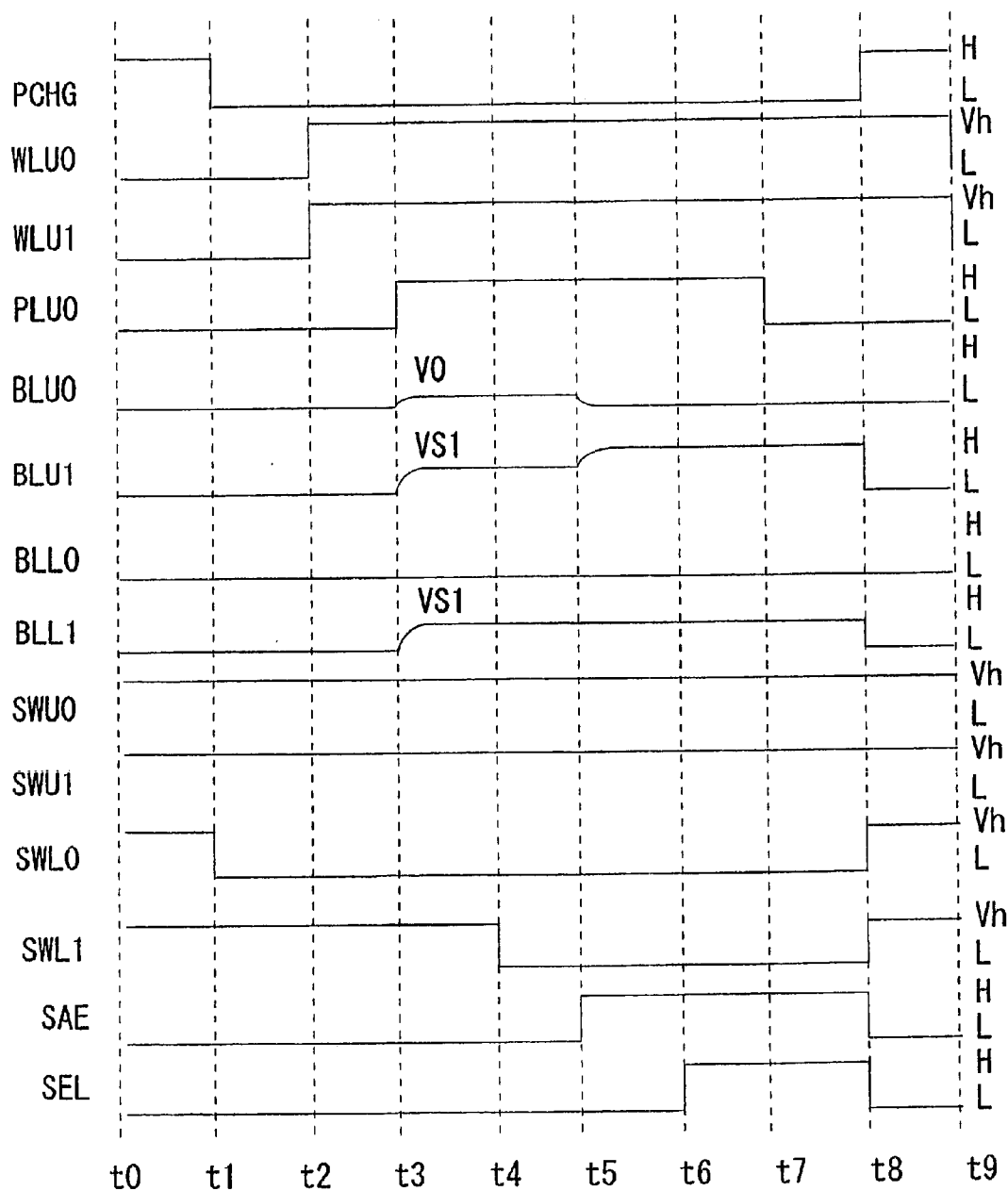
FIG. 8 is a timing chart showing a further example of the operation of the ferroelectric memory according to the second embodiment.

Another operation example 2 of the ferroelectric memory according to the second embodiment will be explained with reference to FIG. 8. FIG. 8 is a timing chart showing the operation example 2 of the ferroelectric memory according to the second embodiment. The operation to be described by the operation example 2 is different from the operation described according to the timing chart shown in FIG. 7 in that the operation of turning off the fourth switch transistor SWLT1 at a time t4 in FIG. 8 to thereby isolate the second bit line BLU1 and the fourth bit line BLL1 connected to each other is added. Thus the capacitance of each bit line at the amplification of data by the corresponding sense amplifier (see a time t5) can be set to one-half the capacitance at data reading. Accordingly, the sense amplifier SA can be reduced in power consumption.

In the present embodiment as described above, the number of the memory cells in the first memory cell block 310 and the number of the second memory cell block 320 are rendered identical. However, the numbers of the memory cells in these blocks 310 and 320 may not be made identical. Data low in read frequency are respectively stored in the block large in the number of the memory cells, and data high in read frequency are respectively stored in the block small in the number of the memory cells, whereby power consumption can be further reduced.

Third Preferred Embodiment

A ferroelectric memory according to a third embodiment of the present invention will hereinafter be described with a 2-transistor 2-capacitor/one-bit type ferroelectric memory as an illustrative example.

The present embodiment is different from the second embodiment in that a memory cell array corresponding to one sequence is divided into three or more memory cell blocks, for example.

Figure 9:
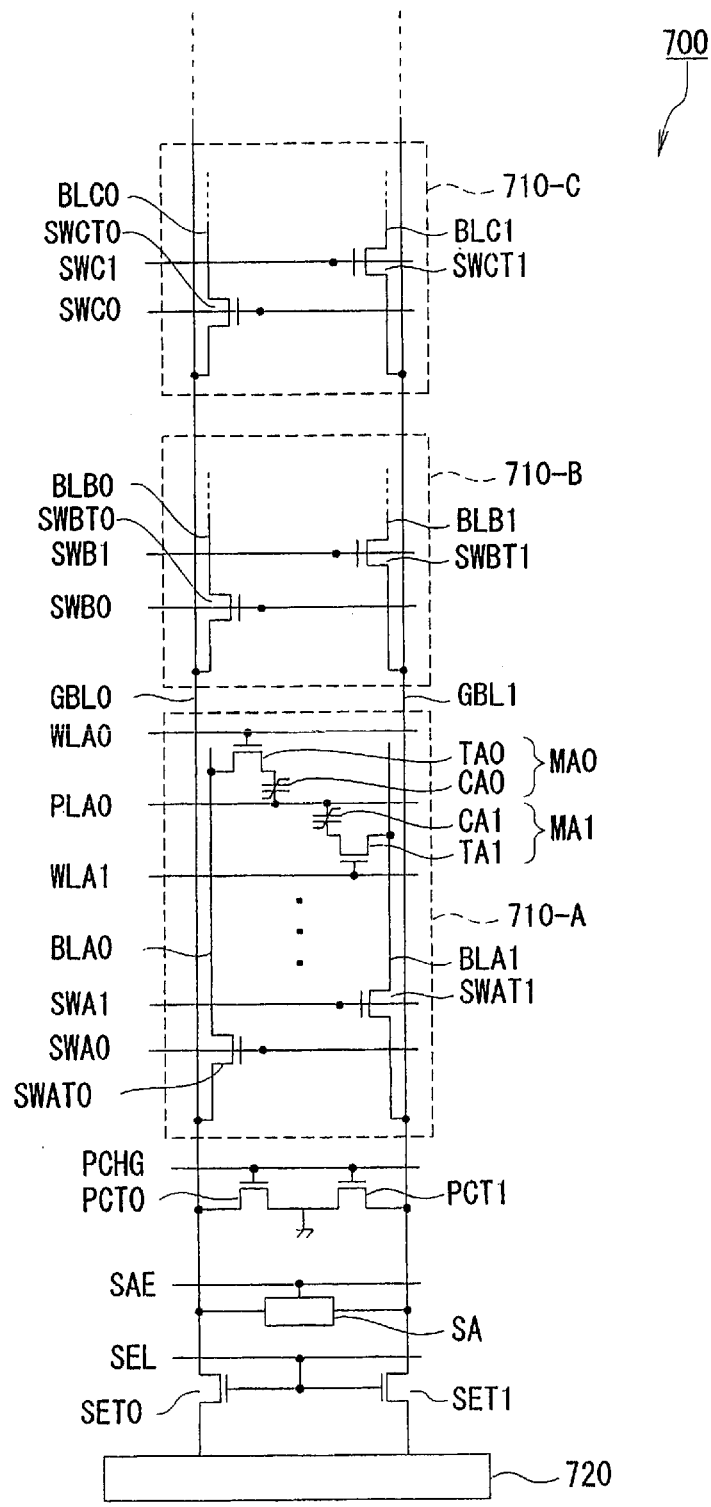
FIG. 9 is a circuit diagram illustrating a configuration of a ferroelectric memory according to a third embodiment.

FIG. 9 is a circuit diagram showing a structure equivalent to one sequence of the memory cell array of the ferroelectric memory according to the present embodiment.

As shown in FIG. 9, a memory cell array of a ferroelectric memory 700 comprises three or more first, second and third memory cell blocks 710-A, 710-B and 710-C, a first precharge transistor PCT0, a second precharge transistor PCT1, a sense amplifier SA, a first bit line selection transistor SET0, a second bit line selection transistor SET1, a first global bit line GBL0, and a second global bit line GBL1, which are provided for each sequence. The first memory cell block 710-A includes a first memory cell MA0, a second memory cell MA1, a first switch transistor SWAT0, a second switch transistor SWAT1, a first bit line (partial line) BLA0, and a second bit line BLA1. As control lines common to the first memory cell block 710-A placed in each sequence, there are provided a first word line WLA0, a second word line WLA1, a first plate line PLA0, a first switch control line SWA0 and a second switch control line SWA1. The blocks subsequent to the second block are similar to the above. In addition, a precharge control line PCHG, an activation signal line SAE and a select signal SEL are provided as control lines common to the first precharge transistor PCT0, the second precharge transistor PCT1, the sense amplifier SA, the first bit line selection transistor SET0, and the second bit line selection transistor SET1 provided in each sequence.

In the present embodiment, the numbers of memory cells in the respective memory cell blocks 710-A, 710-B and 710-C are regarded as identical. Thus the bit lines of these blocks are substantially identical in capacitance.

The first word line WLA0, the second word line WLA1 and the first plate line PLA0 common to each first memory cell block 710-A are arranged in parallel along a row direction of the memory cell array. The first word line WLA0 and the second word line WLA1 are disposed with two as one pair, and one plate line is placed between these two word lines. The word lines and the plate lines of other memory cell blocks 710-B and 710-C are similar to the above.

Figure 15:
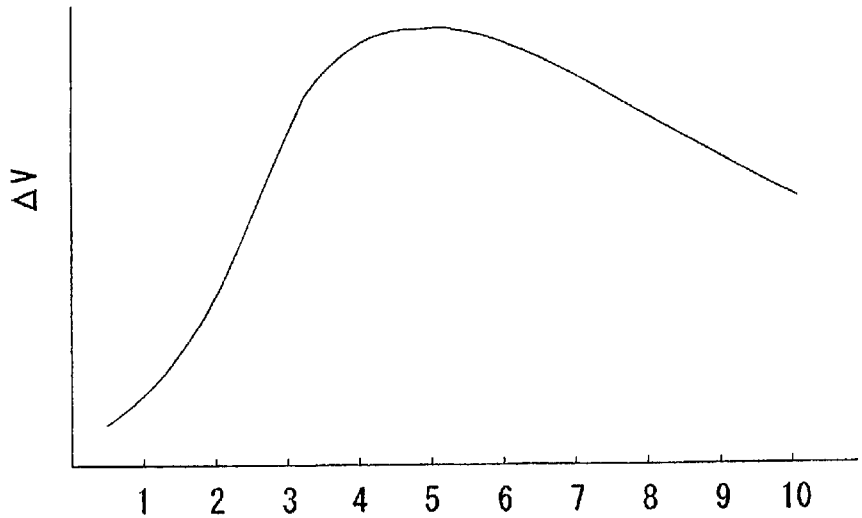
FIG. 15 is a graph for describing the characteristic of a ferroelectric memory.

The first bit line BLA0 and the second bit line BLA1 of the first memory cell block 710-A are placed in parallel with two as one pair along a column direction of the memory cell array. The bit lines in other memory cell blocks 710-B and 710-C are similar to the above. A parasitic capacitance of each bit line is determined according to a junction capacitance of each transistor or wiring capacitance. In the present embodiment, the parasitic capacitances of these bit lines are set in such a manner that the sum of the capacitances of the same bit lines reaches such a value as to obtain a sufficient read margin ΔV (see FIG. 15).

The first global bit line GBL0 and the second global bit line GBL1 are respectively connected to the first bit line BLA0 and the second bit line BLA1 of the first memory cell block 710-A through the first switch transistor SWAT0 and the second switch transistor SWAT1. Here, the first global bit line GBL0 and the second global bit line GBL1 are wired so as to overlap with a layer different from that for the first bit line BLA0 and the second bit line BLA1. The gate of the first switch transistor SWAT0 is connected to the first switch control line SWA0, and the gate of the second switch transistor SWAT1 is connected to the second switch control line SWA1. Other memory cell blocks 720-B and 720-C are similar to the above.

The first memory cell MA0 and the second memory cell MA1 of the first memory cell block 710-A are respectively placed in positions where the first word line WLA0 and the second word line WLA1, and the first bit line BLA0 and the second bit line BLA1 intersect respectively. The first memory cell MA0 and the second memory cell MA1 are respectively provided with a first MOS transistor TA0, a second MOS transistor TA1, a first ferroelectric capacitor CA0, and a second ferroelectric capacitor CA1 one by one. The first MOS transistor TA0 and the second MOS transistor TA1 respectively have gates connected to their corresponding word lines, drains connected to their corresponding bit lines, and sources connected to one ends of their corresponding first and second ferroelectric capacitors CA0 and CA1. The other ends of the first and second ferroelectric capacitors CA0 and CA1 are connected to their corresponding plate lines. The respective memory cells of other memory cell blocks 710-B and 710-C are similar to the above.

The first precharge transistor PCT0 and the second precharge transistor PCT1 respectively have gates connected to the precharge control line PCHG, sources connected to their corresponding bit lines, and drains which are grounded.

The first bit line selection transistor SET0 and the second bit line selection transistor SET1 respectively have gates connected to the select line SEL, sources connected to their corresponding bit lines, and drains connected to a data bus 720.

When the activation signal line SAE is H in level, the sense amplifier SA is activated to amplify and output potentials on the first global bit line GBL0 and the second global bit line GBL1. Incidentally, since the type of the sense amplifier SA is not limited in the present embodiment, the description of a detailed internal configuration will be omitted.

Figure 10:
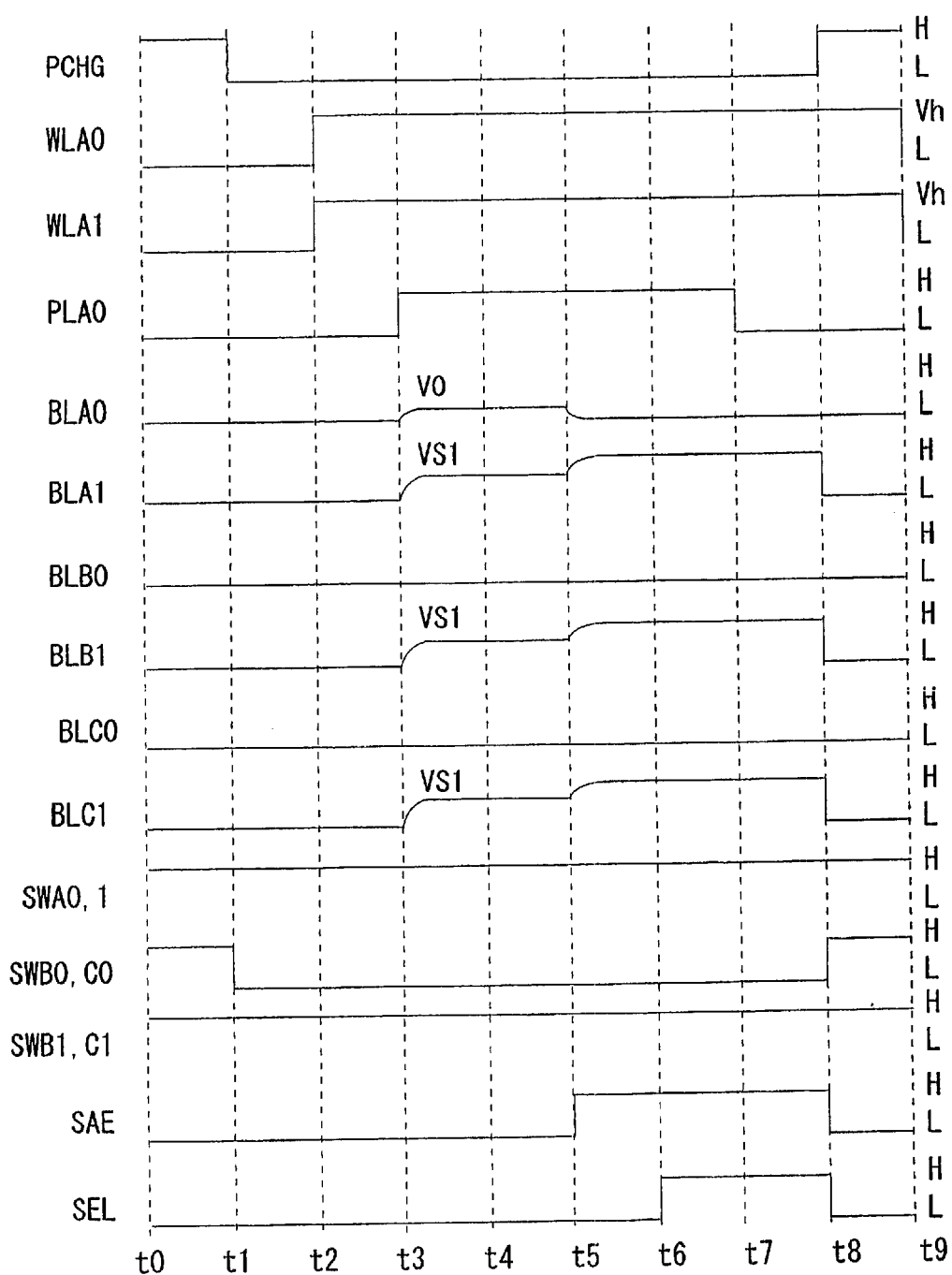
FIG. 10 is a timing chart depicting the operation of the ferroelectric memory according to the third embodiment.

A read operation example 1 in a selection mode for selecting a defective memory cell in the ferroelectric memory 700 provided with the circuit structure shown in FIG. 9 will next be explained by using a timing chart shown in FIG. 10. A description will be made here of, as an example, a case in which the data stored in each of the first memory cell MA0 and the second memory cell MA1 is read. In FIG. 10, 'L' indicates a ground voltage, and 'H' indicates a source voltage Vcc, respectively. 'Vh' indicates a voltage which is lower than the source voltage Vcc and is increased by about a threshold voltage Vt of each of the first and second MOS transistors TA0 and TA1 of the memory cells.

In an initial state (at a time t0), the voltages applied to the first through sixth switch control lines SWA0, SWA1, SWB0, SWB1, SWC0 and SWC1 are respectively of the H level. Thus, since the first switch transistor SWAT0, the third switch transistor SWBT0 and the fifth switch transistor SWCT0, and the second switch transistor SWAT1, the fourth switch transistor SWBT1 and the sixth switch transistor SWCT1 are being turned on, the first bit line BLA0, the third bit line BLB0, and the fifth bit line BLC0 are respectively connected to the first global bit line GBL0. Further, the second bit line BLA1, the fourth bit line BLB1 and the sixth bit line BLC1 are connected to the second global bit line GBL1. Thus the second bit line BLA1, the fourth bit line BLB1 and the sixth bit line BLC1 are connected to the first precharge transistor PCT0 and the second precharge transistor PCT1, where they are precharged.

Let's assume that "1" indicative of one of complementary digitized or binary data is written into a memory cell to be selected, i.e., the second memory cell MA1 herein. The other complementary data "0" is written into the first memory cell MA0. Here, "1" indicates the side inverted in polarization at a ferroelectric capacitor upon reading.

Upon reading the data stored in the memory cell MA1 to be selected, the voltages applied to the precharge control line PCHG is first brought to the L level at a time t1. Thus, since the first precharge transistor PCT0 and the second precharge transistor PCT1 are turned off, the first global bit line GBL0 and the second global bit line GBL1 are respectively brought to a floating state. At this time, the third switch transistor SWBT0 and the fifth switch transistor SWCT0 are turned off.

Consequently, the second memory cell block 710-B and the third memory cell block 710-C are separated from the first global bit line GBL0.

Next, the first word line WLA0 and the second word line WLA1 are respectively brought to the Vh level at a time t2. Thus the first MOS transistor TA0 and the second MOS transistor TA1 of the first memory cell MA0 and the second memory cell MA1 are turned on so that one terminals of the first ferroelectric capacitor CA0 and the second ferroelectric capacitor CA1 are respectively rendered conductive to the first bit line BLA0 and the second bit line BLA1. The reason why the first word line WLA0 and the second word line WLA1 are respectively brought to the Vh level other than the H level, is that the output voltages (drain voltages) of the first MOS transistor TA0 and second MOS transistor TA1 are reduced by Vt as compared with their input voltages (gate voltages).

Subsequently, the first plate line PLA0 is brought to the H level at a time t3. Consequently, the voltage on the first plate line PLA0 is applied to the first bit line BLA0 and the second bit line BLA1 through the first ferroelectric capacitor CA0, the second ferroelectric capacitor CA1, and the first MOS transistor TA0 and the second MOS transistor TA1. Thus a read voltage (V0 or VS1) is developed in each of the first bit line BLA0 and the second bit line BLA1. Since the bit lines on the second global bit line GBL1 side, of the bit lines of the respective memory cell blocks 710-A, 710-B and 710-C, are connected to the global bit line, the second global bit line GBL1 is sufficiently large in parasitic capacitance. Therefore, a read margin ΔV=VS1−V0 becomes great too.

At a time t5, the activation signal line SAE is brought to the H level to activate the sense amplifier SA. Thus the voltages applied to the first global bit line GBL0 and the second global bit line GBL1 are amplified.

Subsequently, the select line SEL is brought to the H level at a time t6. Consequently, the first bit line selection transistor SET0 and the second bit line selection transistor SET1 are turned on so that the voltages of the first global bit line GBL0 and the second global bit line GBL1 are outputted to the data bus 720.

Next, the voltage applied to the fist plate line PLA0 is returned to the L level at a time t7.

At a time t8, the voltage applied to the precharge control line PCHG is returned to the H level, and the voltages applied to the activation signal line SAE and the select line SEL are respectively brought to the L level. Consequently, the first precharge transistor PCT0 and the second precharge transistor PCT1 are turned on so that the first global bit line GBL0 and the second global bit line GBL1 are grounded and the sense amplifier SA does not output read data. At the time t8 as well, the third switch control line SWB0 and the fifth switch control line SWC0 are respectively returned to the H level. Thus, since the third switch transistor SWBT0 and the fifth switch transistor SWCT0 are turned on, the third bit line BLB0 and the fifth bit line BLC0 are connected to the first global bit line GBL0.

At a time t9, the voltages on the first word line WLA0 and the second word line WLA1 are respectively brought to the L level to turn off the first MOS transistor TA0 and the second MOS transistor TA1. Thus the read operation is completed.

The above-described read voltages are detected to select the corresponding defective memory cell.

Incidentally, the operation of reading stored data from other memory cells (no shown) of the first memory cell block 710-A is also substantially identical to the operation of reading the data from the above-described memory cell MA1.

On the other hand, when it is desired to read stored data from other memory cell blocks 710-B and 710-C, the operation of reading the data therefrom is similar to the operation of reading the data from the above-described memory cell MA1 except that the bit line selection transistor, etc. are different.

In order to use the ferroelectric memory according to the present embodiment in a normal mode, only the switch transistors (SWAT0 and SWAT1 or SWBT0 and SWBT1) on the accessing side are kept in an H state, whereby the writing or reading of data can be carried out as usual.

Thus, owing to the reason similar to the ferroelectric memory according to the first embodiment, the ferroelectric memory according to the present embodiment is capable of increasing the capacitance of each bit line on the storage side of "1" data to thereby apparently reduce a read margin of each memory cell that will be degraded with time according to its use. Accordingly, each memory cell that will be rendered defective with time although its defect is not pronounced in the initial stage, can be selected without carrying out a long-time degradation accelerated test or the like.

Further, according to the ferroelectric memory of the present embodiment, the pairs of memory cells are respectively blocked according to the sets of respective two switch transistors, whereby the capacitance of a desired bit line (partial line) can be controlled arbitrarily and adjustably. Thus, since selective conditions can be set finely, each defective memory cell can be selected more accurately.

Figure 11:
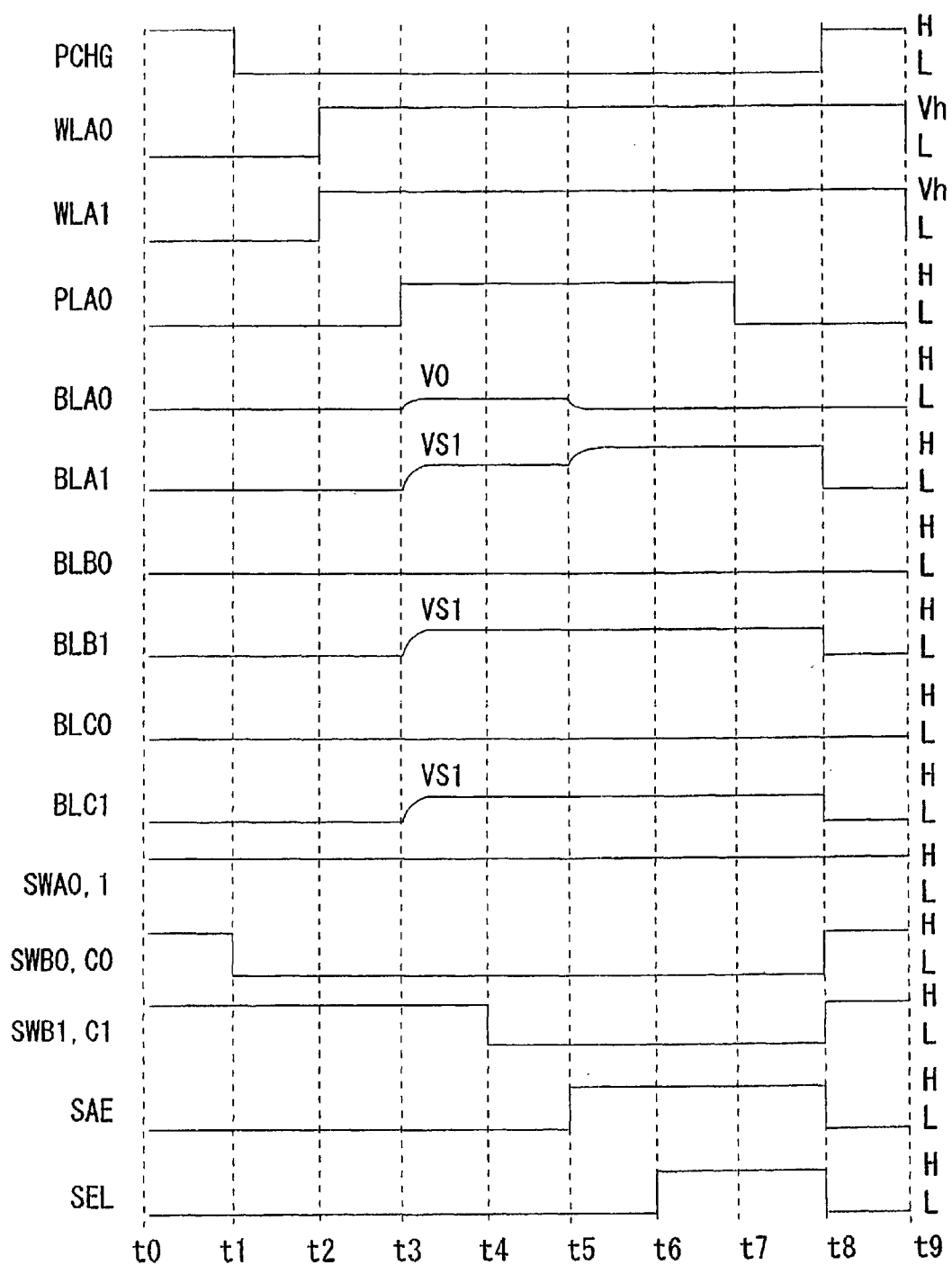
FIG. 11 is a timing chart showing another example of the operation of the ferroelectric memory according to the third embodiment.
Figure 12:
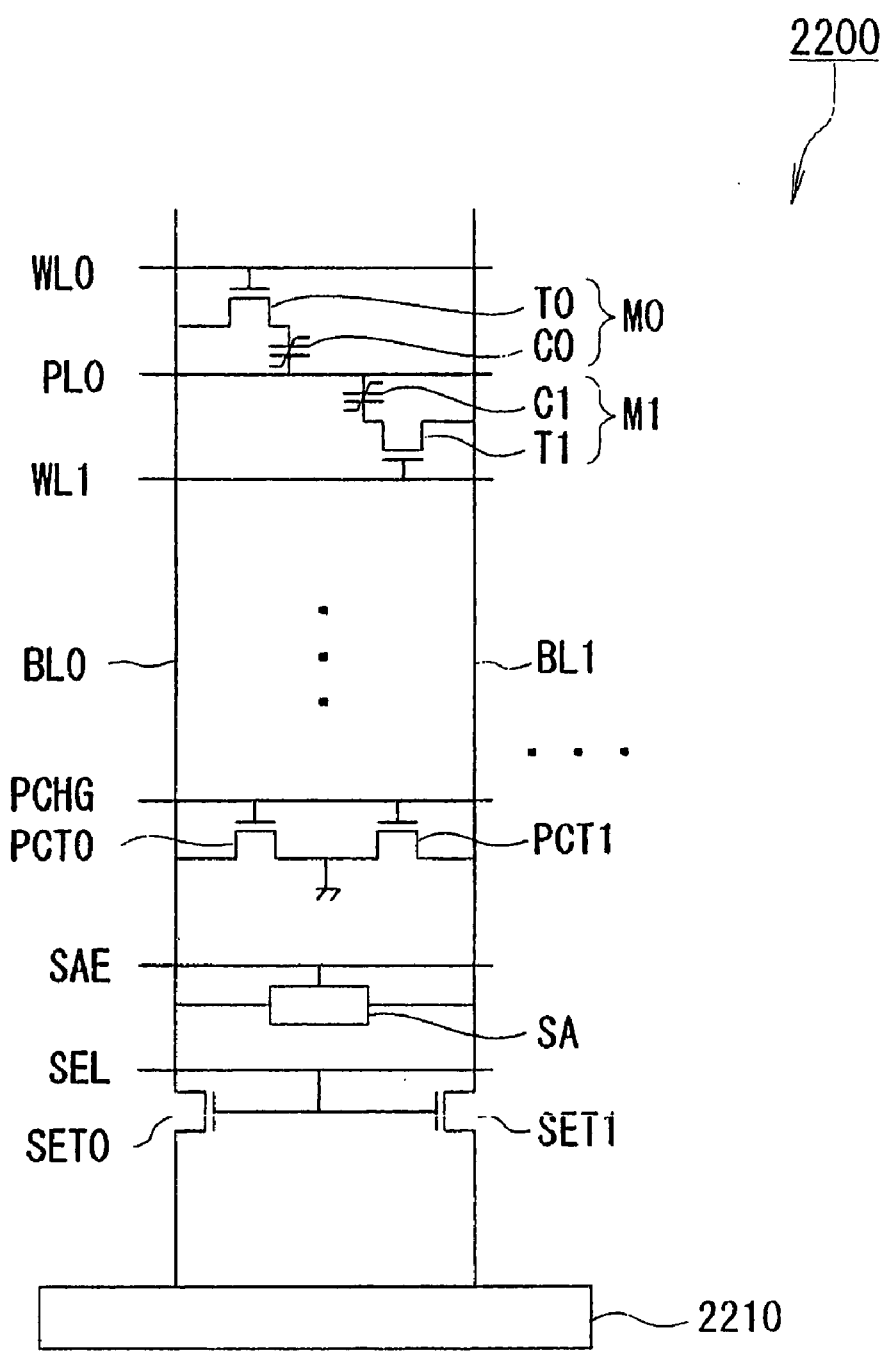
FIG. 12 is a circuit diagram illustrating a configuration of a conventional ferroelectric memory.
Figure 13:
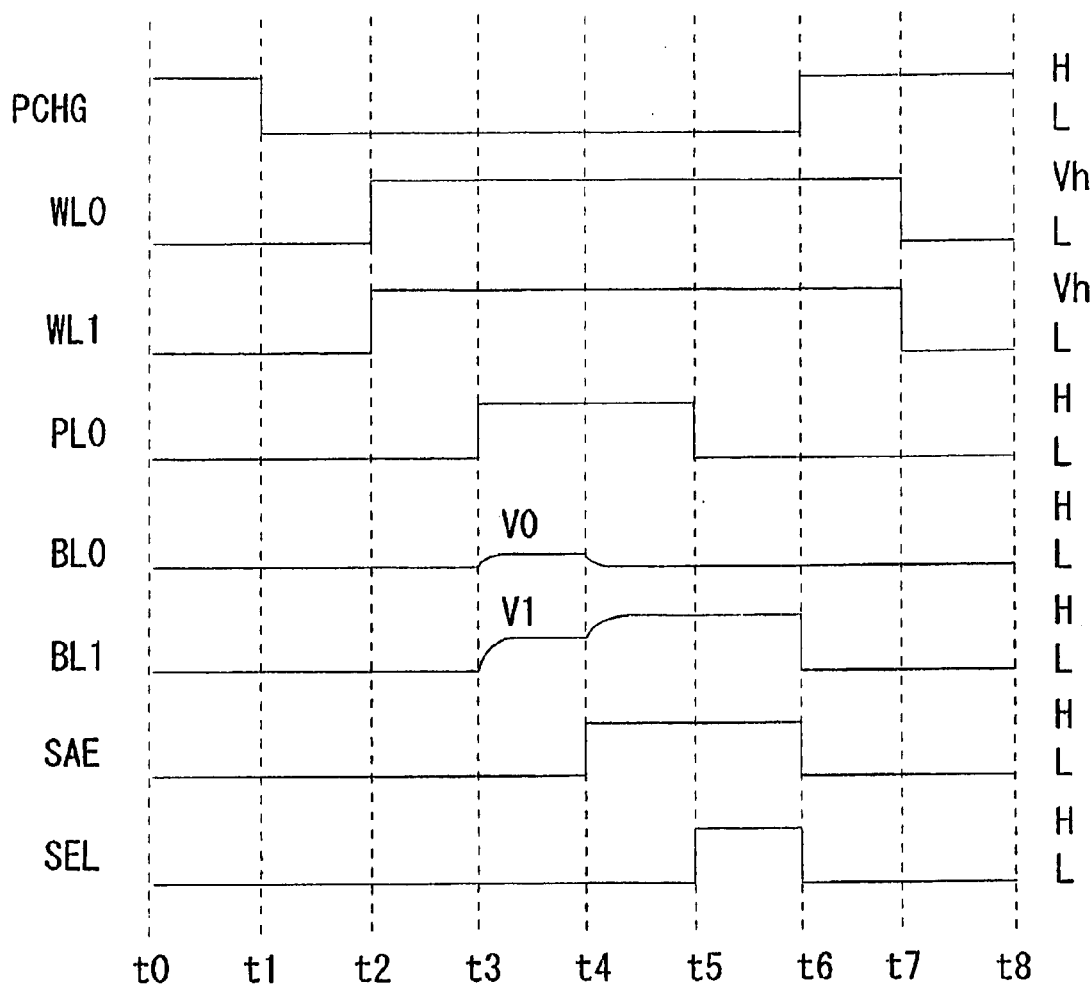
FIG. 13 is a timing chart showing the operation of the conventional ferroelectric memory.
Figure 14:
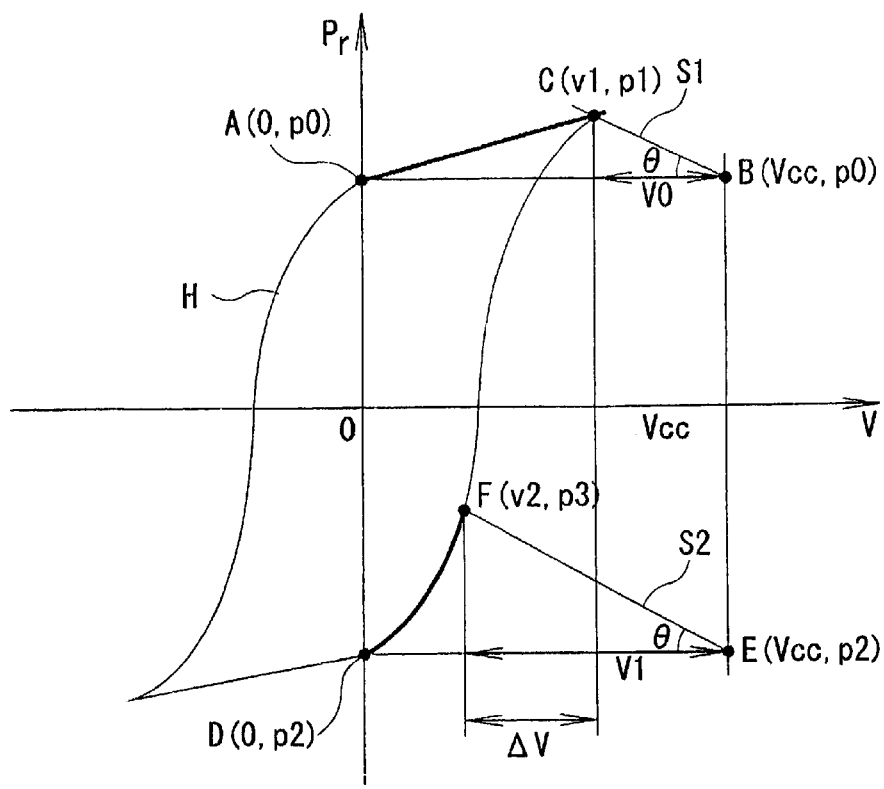
FIG. 14 is a conceptual diagram for describing state shifts of a ferroelectric memory capacitor.

Another operation example 2 of the ferroelectric memory according to the third embodiment will be explained with reference to FIG. 11. FIG. 11 is a timing chart showing the operation example 2 of the ferroelectric memory according to the third embodiment. The operation to be described by the operation example 2 is different from the operation described according to the timing chart shown in FIG. 10 in that the operation of turning off the fourth switch transistor SWBT1 and the sixth switch transistor SWCT1 at a time t4 in FIG. 11 to thereby isolate the fourth bit line BLB1 and the sixth bit line BLC1 connected to each other from the global bit line GBL1 is added. Thus the capacitance of each bit line at the amplification of data by the corresponding sense amplifier (see a time t5) can be set to one-half the capacitance at data reading or ½ under the control of the number of blocks to be separated. Accordingly, the sense amplifier SA can greatly be reduced in power consumption.

In the present embodiment as described above, the numbers of the memory cells in the respective memory cell blocks 710-A, 710-B and 710-C are set identical to each other. However, the numbers of the memory cells in the these blocks may not be made identical.

While all the embodiments mentioned above have been described with the 2T2C/bit type memory cells as examples, the construction of the present invention can be of course applied even to a 1T1C/bit type memory cell, for example.

According to the present invention as described above in detail, a ferroelectric memory is provided which includes a circuit structure capable of selecting a defective ferroelectric memory cell that could not be selected as a defective or fail cell without depending on a long-time accelerated degradation test since its defect has not heretofore been manifested immediately after its manufacture. Further, a method of carrying out a defective memory cell selection efficiently by use of the ferroelectric memory equipped with the aforementioned circuit structure is provided.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A ferroelectric memory comprising:

a first memory cell which is provided at a point where a first word line and a first or second bit line intersect, and has a first ferroelectric capacitor formed with a ferroelectric material as an insulating film, and a first transistor having a control electrode connected to the first word line, a first electrode connected to the first or second bit line, and a second electrode connected to a first electrode of the first ferroelectric capacitor;

a first sense amplifier connected to the first and second bit lines, for amplifying a signal read from the first memory cell;

a second memory cell which is provided at a point where a second word line and a third or fourth bit line intersect, and has a second ferroelectric capacitor formed with a ferroelectric material as an insulating film, and a second transistor having a control electrode connected to the second word line, a first electrode connected to the third or fourth bit line, and a second electrode connected to a first electrode of the second ferroelectric capacitor;

a second sense amplifier connected to the third and fourth bit lines, for amplifying a signal read from the second memory cell;

a first switch for electrically connecting the first bit line and the third bit line; and a second switch for electrically connecting the second bit line and the fourth bit line.

2. The ferroelectric memory in accordance with claim 1, said ferroelectric memory further comprises, a first plate line connected to a second electrode of the first ferroelectric capacitor so as to supply a voltage to the second electrode; and a second plate line connected to a second electrode of the second ferroelectric capacitor so as to supply a voltage to the second electrode.

3. The ferroelectric memory in accordance with claim 2, said ferroelectric memory further comprises, a first precharge circuit connected to the first and second bit lines so as to set voltage levels on the first and second bit lines to given voltage levels respectively; and a second precharge circuit connected to the third and fourth bit lines so as to set voltage levels on the third and fourth bit lines to given voltage levels respectively.

4. The ferroelectric memory in accordance with claim 3, said ferroelectric memory further comprises, a first selector for electrically connecting a first data bus and the first and second bit lines; and a second selector for electrically connecting a second data bus and the third and fourth bit lines.

5. A ferroelectric memory comprising:

first and second global lines; and a plurality of memory blocks, said each memory block comprising:

at least one memory cell which is provided at a point where a word line and a first or second bit line intersect, and has a ferroelectric capacitor formed with a ferroelectric material as an insulating film, and a transistor having a control electrode connected to the word line, a first electrode connected to the first or second bit line, and a second electrode connected to a first electrode of the ferroelectric capacitor;

a first switch for electrically connecting the first global line and the first bit line;

a second switch for electrically connecting the second global line and the second bit line; and a sense amplifier connected to the first and second global lines so as to amplify voltage levels on the global lines.

6. The ferroelectric memory in accordance with claim 5, said ferroelectric memory further comprises, a first plate line connected to a second electrode of the ferroelectric capacitor so as to supply a voltage to the second electrode.

7. The ferroelectric memory in accordance with claim 6, said ferroelectric memory further comprises, a precharge circuit connected to the first and second global lines so as to set voltage levels on the first and second global lines to given voltage levels respectively.

8. The ferroelectric memory in accordance with claim 7, said ferroelectric memory further comprises, a selector for electrically connecting a data bus and the first and second global lines.

9. A test method of a ferroelectric memory, the method comprising:

setting a first or second bit line connected with a first memory cell having a first ferroelectric capacitor with a ferroelectric material as an insulating film, and a third or fourth bit line connected with a second memory cell having a second ferroelectric capacitor with a ferroelectric material as an insulating film to a first voltage level;

electrically connecting the first ferroelectric capacitor and the first or second bit line;

electrically connecting the second ferroelectric capacitor and the third or fourth bit line;

electrically connecting the first and fourth bit lines;

amplifying voltage levels on the first and second bit lines; and comparing the amplified voltage levels on the first and second bit lines.

10. The test method of the ferroelectric memory in accordance with claim 9, the method further comprising:

electrically connecting the first and fourth bit lines according to a voltage level applied to a control electrode of a first transistor having a first electrode connected to the fist bit line and a second electrode connected to the fourth bit line.

11. The test method of the ferroelectric memory in accordance with claim 10, the method further comprising:

electrically connecting the first ferroelectric capacitor and the first or second bit line according to a voltage level applied to a control electrode of a first transistor having a first electrode connected to one end of the first ferroelectric capacitor and a second electrode connected to the first or second bit line; and electrically connecting the second ferroelectric capacitor and the third or fourth bit line according to a voltage level applied to a control electrode of a second transistor having a first electrode connected to one end of the second ferroelectric capacitor and a second electrode connected to the third or fourth bit line.

12. The test method of the ferroelectric memory in accordance with claim 9, the method further comprising:

electrically connecting the second and third bit lines in place of the electrical connection of the first and fourth bit lines.

13. The test method of the ferroelectric memory in accordance with claim 12, the method further comprising:

electrically connecting the second and third bit lines according to a voltage level applied to a control electrode of a second transistor having a first electrode connected to the second bit line and a second electrode connected to the third bit line.

14. The test method of the ferroelectric memory in accordance with claim 13, the method further comprising:

electrically connecting the first ferroelectric capacitor and the first or second bit line according to a voltage level applied to a control electrode of a first transistor having a first electrode connected to one end of the first ferroelectric capacitor and a second electrode connected to the first or second bit line; and electrically connecting the second ferroelectric capacitor and the third or fourth bit line according to a voltage level applied to a control electrode of a second transistor having a first electrode connected to one end of the second ferroelectric capacitor and a second electrode connected to the third or fourth bit line.

* * * * *